(12) United States Patent
Shin et al.

(10) Patent No.: US 11,215,866 B2
(45) Date of Patent: Jan. 4, 2022

(54) DISPLAY DEVICE, PHOTOMASK FOR COLOR FILTER, AND MANUFACTURING METHOD OF DISPLAY DEVICE

(71) Applicant: SAMSUNG DISPLAY CO., LTD., Yongin-si (KR)

(72) Inventors: Dong Hee Shin, Asan-si (KR); Byoung Sun Na, Seoul (KR); Yoo Mi Ra, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/782,401

(22) Filed: Feb. 5, 2020

(65) Prior Publication Data
US 2020/0379294 A1 Dec. 3, 2020

(30) Foreign Application Priority Data

May 27, 2019 (KR) .................. 10-2019-0061947

(51) Int. Cl.
*G02F 1/1335* (2006.01)
*G02F 1/1362* (2006.01)

(52) U.S. Cl.
CPC .. *G02F 1/133516* (2013.01); *G02F 1/136286* (2013.01); *G02F 1/136222* (2021.01)

(58) Field of Classification Search
CPC ............ G02F 1/133345; G02F 1/1368; G02F 1/133514; G02F 1/133512; G02F 1/1339; G02F 1/133516; G02F 1/136286; G02F 1/136222

USPC .................................................. 349/106–109
See application file for complete search history.

(56) References Cited

U.S. PATENT DOCUMENTS

| 6,384,882 | B1* | 5/2002 | Nagayama | ........ G02F 1/133512 349/110 |
|---|---|---|---|---|
| 2014/0347612 | A1* | 11/2014 | Park | .................. G02F 1/133514 349/106 |
| 2015/0168771 | A1* | 6/2015 | Kim | .................. G02F 1/136204 257/72 |
| 2017/0199431 | A1* | 7/2017 | Kim | .................. G02F 1/133514 |

FOREIGN PATENT DOCUMENTS

| JP | 2004-139024 A | 5/2004 |
|---|---|---|
| KR | 10-0848087 | 7/2008 |
| KR | 10-0935674 | 1/2010 |
| KR | 10-2014-0140209 A | 12/2014 |

* cited by examiner

*Primary Examiner* — Charles S Chang
(74) *Attorney, Agent, or Firm* — Lewis Roca Rothgerber Christie LLP

(57) ABSTRACT

A display device includes: a first substrate including a display area and a non-display area including a first non-display area and a second non-display area on respective sides of the display area with respect to a first direction; a color filter in the display area and including a first color filter, a second color filter, and a third color filter; and a color filter dam in the non-display area, wherein the color filter dam includes a first color filter dam in the first non-display area and a second color filter dam in the second non-display area, the first color filter dam includes a same material as the first color filter, and the second color filter dam includes a same material as the second color filter.

19 Claims, 20 Drawing Sheets

DISPLAY DEVICE, PHOTOMASK FOR COLOR FILTER, AND MANUFACTURING METHOD OF DISPLAY DEVICE

CROSS-REFERENCE TO RELATED APPLICATION

This application claims priority to and the benefit of Korean Patent Application No. 10-2019-0061947 filed in the Korean Intellectual Property Office on May 27, 2019, the entire contents of which are incorporated herein by reference.

BACKGROUND

1. Field

The present disclosure relates to a display device, a photomask for a color filter, and a method for manufacturing a display device.

2. Description of the Related Art

A liquid crystal display is widely used as a display device. A liquid crystal display includes two display panels having field generating electrodes such as a pixel electrode and a common electrode, and a liquid crystal layer provided between the display panels. The liquid crystal display applies a voltage to the field generating electrodes to form an electric field on the liquid crystal layer, determines alignment of liquid crystal molecules included in the liquid crystal layer, and controls polarization of incident light to display an image.

Recently, display devices have become larger. A mask is very small compared to an area of the display device, so it is difficult to form a pattern on an entire surface of a large display device with a single shot. Therefore, the display device is divided into a plurality of regions, and the respective regions are sequentially exposed according to a plurality of shots by a division and exposure process, thereby forming a pattern.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide for a display device without a stitch defect that causes a border line between shot regions to be visible to a user in the case of a division exposure process, and a method for manufacturing the same.

Embodiments of the present invention provide a mask for reducing or minimizing a process by forming different patterns at respective ends of a display device without an increase of the number of shots, and a method for manufacturing a display device.

Embodiments of the present invention provide a display device for preventing defects caused by an overflow of a sealant or an alignment layer by including a color filter dam, and preventing an upper panel from drooping and preventing an upper panel and a lower panel from being short-circuited by including a support pattern overlapping a spacer.

An exemplary embodiment provides a display device including: a first substrate including a display area and a non-display area including a first non-display area and a second non-display area on respective sides of the display area with respect to a first direction; a color filter in the display area and including a first color filter, a second color filter, and a third color filter; and a color filter dam in the non-display area, wherein the color filter dam includes a first color filter dam in the first non-display area and a second color filter dam in the second non-display area, the first color filter dam includes a same material as the first color filter, and the second color filter dam includes a same material as the second color filter.

The display device may further include a sealant in the non-display area and surrounding at least part of the non-display area and the display area.

The first color filter dam may be between a portion of the sealant that is in the first non-display area, and the display area, and the second color filter dam may be between a portion of the sealant that is in the second non-display area, and the display area.

The display device may further include: a gate conductive layer on the first substrate; and a gate insulating layer on the gate conductive layer, wherein the color filter dam may be on the gate insulating layer and may overlap the gate conductive layer.

The display device may further include: a data conductive layer on the first substrate; and an inorganic insulating layer on the data conductive layer, wherein the color filter dam may be on the inorganic insulating layer and may overlap the data conductive layer.

The display device may further include a gate driver in the non-display area, wherein the gate driver may include a transistor, and the color filter dam may overlap the transistor.

The display device may further include: a support pattern in the non-display area; and a spacer overlapping the support pattern.

The support pattern may include a first support pattern in the first non-display area and a second support pattern in the second non-display area, the first support pattern may include a same material as the first color filter dam, and the second support pattern may include a same material as the second color filter dam.

The non-display area may further include a third non-display area and a fourth non-display area with the display area therebetween with respect to a second direction crossing the first direction, the color filter dam may further include a third color filter dam in the third non-display area and a fourth color filter dam in the fourth non-display area, and the third color filter dam and the fourth color filter dam may include a same material as one of the first color filter, the second color filter, and the third color filter.

The third color filter dam and the fourth color filter dam may include a same material as the third color filter.

Another embodiment provides a photomask for a color filter, including: a first mask for a first color filter including a first pattern area and a second pattern area; a second mask for a second color filter including a third pattern area and a fourth pattern area; and a third mask for a third color filter including a fifth pattern area, wherein the first pattern area includes a first display pattern area, the fourth pattern area includes a second display pattern area, the first display pattern area and the second pattern area include a pattern of the first color filter of a display area of a display device, the third pattern area and the second display pattern area include a pattern of the second color filter of the display area, the fifth pattern area includes a pattern of the third color filter of the display area, and a width of the first display pattern area, a width of the third pattern area, and a width of the fifth pattern area are different from each other.

A summation of the width of the first display pattern area and a width of the second pattern area may be different from the width of the third pattern area and the width of the fifth pattern area.

A width of the second display pattern area, the width of the second pattern area, and the width of the fifth pattern area may be different from each other.

A summation of the width of the second display pattern area and the width of the third pattern area may be different from the width of the second pattern area and the width of the fifth pattern area.

The first pattern area may further include a first non-display pattern area including a pattern of the first color filter of the non-display area of the display device.

The fourth pattern area may further include a second non-display pattern area including a pattern of the second color filter of the non-display area.

The fifth pattern area may include a third non-display pattern area disposed on a first side.

The fifth pattern area may include a fourth non-display pattern area on a second side.

Another embodiment provides a method for manufacturing a display device, including: exposing an initial shot region of a first color filter with a first pattern area of a first mask; dividing a display area of the display device for displaying an image into a plurality of shot regions and exposing the first color filter with a second pattern area of the first mask; dividing the display area into a plurality of shot regions and exposing a second color filter with a third pattern area of a second mask; exposing a final shot region of the second color filter with a fourth pattern area of the second mask; and dividing the display area into a plurality of shot regions and exposing a third color filter with a fifth pattern area of a third mask, wherein a first border line between the shot regions of the first color filter, a second border line between the shot regions of the second color filter, and a third border line between the shot regions of the third color filter do not overlap each other.

The exposing of the initial shot region of the first color filter with the first pattern area of the first mask may be performed by exposing a first display shot region and a first non-display shot region of the initial shot region of the first color filter, the exposing of the final shot region of the second color filter with the fourth pattern area of the second mask may be performed by exposing a second display shot region and a second non-display shot region of the final shot region of the second color filter, the first display shot region and the second display shot region may be in the display area, and the first non-display shot region and the second non-display shot region may be in the non-display area.

According to an exemplary embodiment of the display device and the method for manufacturing a display device, the stitch defect in which the border line between shot regions caused by a division and exposure process is visible to the user may be prevented in the display device.

According to an exemplary embodiment of the mask and the method for manufacturing a display device, different patterns may be formed at the respective ends of the display device with a reduced or minimum number of shots, thereby simplifying the process.

Further, according to an exemplary embodiment, the display device may include a color filter dam to prevent the defect caused by an overflow of a sealant or an alignment layer, and may include a support pattern overlapping a spacer to prevent the upper panel from drooping and the upper panel and the lower panel from being short-circuited.

DETAILED DESCRIPTION

Figure 1:
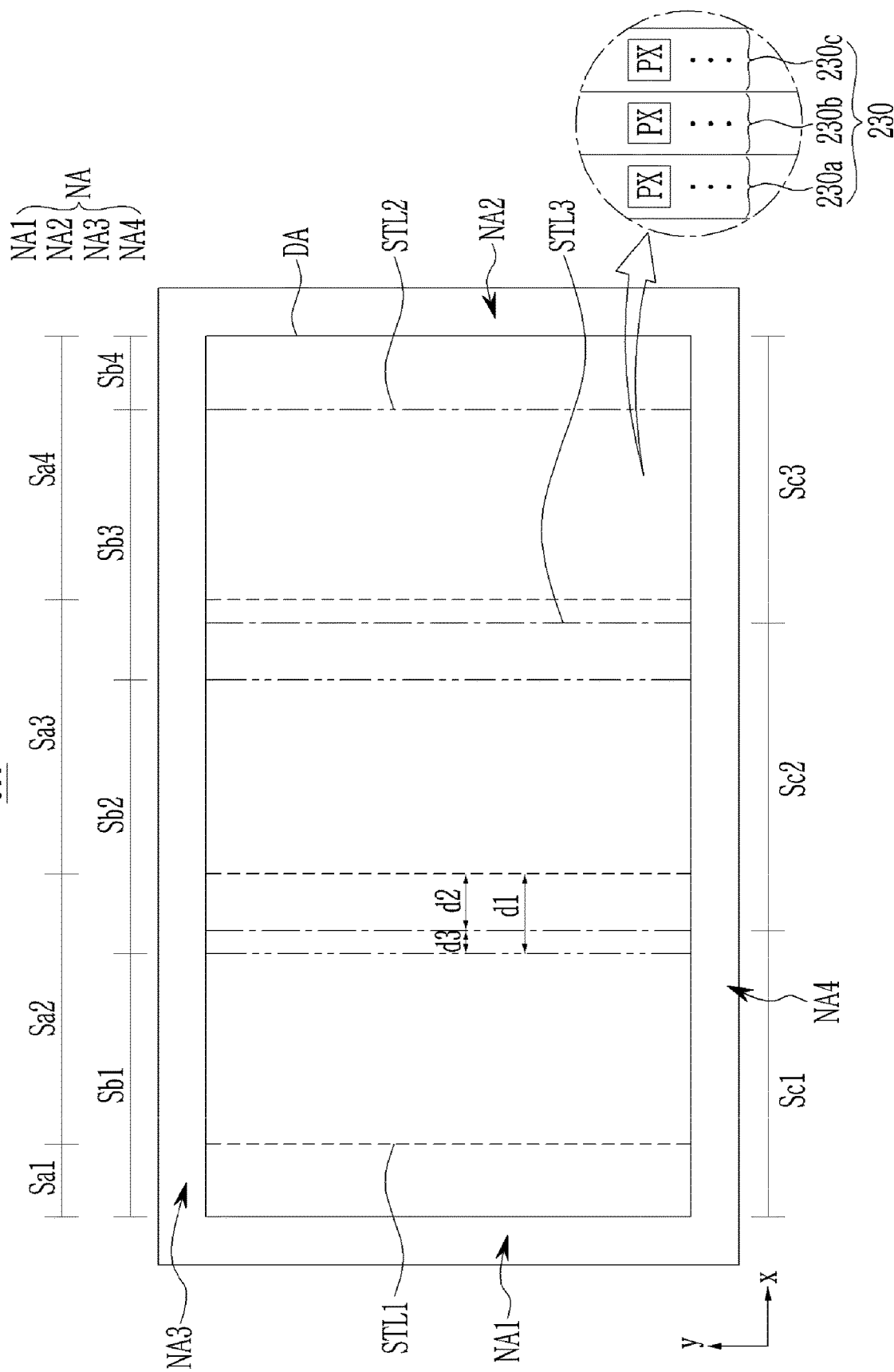
FIG. 1 shows a schematic diagram of a shot region of a display device according to an exemplary embodiment.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

The size and thickness of the configurations are optionally shown in the drawings for convenience of description, and the present invention is not limited to the drawings. In the drawings, the thickness of layers, films, panels, regions, etc., may be exaggerated for clarity. For understanding and ease of description, the thickness of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device according to an exemplary embodiment will now be described with reference to FIG. 1. FIG. 1 shows a schematic diagram of a shot region of a display device.

Referring to FIG. 1, the display device includes a display panel 300. The display panel 300 includes a display area (DA) including a plurality of pixels PX and is configured for displaying images, and a non-display area (NA) that is not configured for displaying images.

The non-display area (NA) may be partially or fully around (e.g., surrounding) the display area (DA). According to an embodiment, the non-display area (NA) includes a first non-display area NA1, a second non-display area NA2, a third non-display area NA3, and a fourth non-display area NA4.

The first non-display area NA1 and the second non-display area NA2 are provided at respective sides of the display area (DA) with reference to a first direction (x). That is, the first non-display area NA1 and the second non-display area NA2 are provided with the display area (DA) therebetween with respect to the first direction (x). The third non-display area NA3 and the fourth non-display area NA4 are provided at respective sides of the display area (DA) with respect to a second direction (y). That is, the third non-display area NA3 and the fourth non-display area NA4 are provided with the display area (DA) therebetween with respect to the second direction (y).

The display area (DA) includes a plurality of pixels PX arranged in a matrix form, and a color filter 230. The color filter 230 is for displaying different colors and includes a first color filter 230a, a second color filter 230b, and a third color filter 230c. The first color filter 230a, the second color filter 230b, and the third color filter 230c extend in the second direction (y) along a pixel column, and may be arranged one by one along the first direction (x). The respective color filters 230a, 230b, and 230c may include pigments for expressing colors expressed by the corresponding pixels PX.

In the display device according to an exemplary embodiment, the color filter 230 may be formed by exposing and patterning the first color filter 230a, the second color filter 230b, and the third color filter 230c. For example, the first color filter 230a, the second color filter 230b, and the third color filter 230c may be formed by a division and exposure process for respectively dividing the display panel 300 into a plurality of regions and exposing the plurality of regions with a plurality of shots.

The first color filter 230a is formed by dividing the display panel 300 into a first shot region Sa1 (also referred to as a first shot region), a second shot region Sa2, a third shot region Sa3, and a fourth shot region Sa4, and exposing each of the respective shot regions. Hereinafter, the shot regions in the display panel 300 divided for forming a pattern of the first color filter 230a will be referred to as "a first shot region Sa1 of the first color filter," "a second shot region Sa2 of the first color filter," "a third shot region Sa3 of the first color filter," and "a fourth shot region Sa4 of the first color filter."

Here, the "shot" signifies performance of one exposure by use of a mask. A region exposed by one shot will be referred to as a "shot region" in the display device.

The display panel 300 includes a first shot region Sa1 of the first color filter, a second shot region Sa2 of the first color filter, a third shot region Sa3 of the first color filter, and a fourth shot region Sa4 of the first color filter arranged along the first direction (x). The first shot region Sa1 of the first color filter, the second shot region Sa2 of the first color filter, the third shot region Sa3 of the first color filter, and the fourth shot region Sa4 of the first color filter may be provided in the display area (DA). First border lines STL1 extending in the second direction (y) are provided at a border between the first shot region Sa1 of the first color filter and the second shot region Sa2 of the first color filter, a border between the second shot region Sa2 of the first color filter and the third shot region Sa3 of the first color filter, and a border between the third shot region Sa3 of the first color filter and the fourth shot region Sa4 of the first color filter. A width of the first shot region Sa1 of the first color filter may not be equivalent to a width of the second shot region Sa2 of the first color filter, and a width of the first shot region Sa1 of the first color filter may be less than the width of the second shot region Sa2 of the first color filter. The widths of the second shot region Sa2 of the first color filter, the third shot region Sa3 of the first color filter, and the fourth shot region Sa4 of the first color filter may be equivalent to each other. In this instance, the width signifies a length in the first direction (x).

The second color filter 230b is formed by dividing the display panel 300 into a first shot region Sb1, a second shot region Sb2, a third shot region Sb3, and a fourth shot region Sb4 (also referred to as a final shot region) and exposing each of the respective shot regions. Hereinafter, the shot regions of the display panel 300 divided for forming a pattern of the second color filter 230b will be referred to as "a first shot region Sb1 of the second color filter," "a second shot region Sb2 of the second color filter," "a third shot region Sb3 of the second color filter," and "a fourth shot region Sb4 of the second color filter."

The display panel 300 includes the first shot region Sb1 of the second color filter, the second shot region Sb2 of the second color filter, the third shot region Sb3 of the second color filter, and the fourth shot region Sb4 of the second color filter arranged along the first direction (x). The first shot region Sb1 of the second color filter, the second shot region Sb2 of the second color filter, the third shot region Sb3 of the second color filter, and the fourth shot region Sb4 of the second color filter may be provided in the display area (DA). Second border lines STL2 extending in the second direction (y) are provided at a border between the first shot region Sb1 of the second color filter and the second shot region Sb2 of the second color filter, a border between the second shot region Sb2 of the second color filter and the third shot region Sb3 of the second color filter, and a border between the third shot region Sb3 of the second color filter and the fourth shot region Sb4 of the second color filter. A width of the fourth shot region Sb4 of the second color filter may not be equivalent to a width of the third shot region Sb3 of the second color filter, and the width of the fourth shot region Sb4 of the second color filter may be less than the width of the third shot region Sb3 of the second color filter.

The widths of the first shot region Sb1 of the second color filter, the second shot region Sb2 of the second color filter, and the third shot region Sb3 of the second color filter may be equivalent to each other. In this instance, the width signifies a length in the first direction (x).

The third color filter 230c is formed by dividing the display panel 300 into a first shot region Sc1, a second shot region Sc2, and a third shot region Sc3 and exposing each of the respective shot regions. Hereinafter, shot regions of the display panel 300 divided for forming a pattern of the third color filter 230c will be referred to as "a first shot region Sc1 of the third color filter," "a second shot region Sc2 of the third color filter," and "a third shot region Sc3 of the third color filter."

The display panel 300 includes a first shot region Sc1 of the third color filter, a second shot region Sc2 of the third color filter, and a third shot region Sc3 of the third color filter arranged along the first direction (x). The first shot region Sc1 of the third color filter, the second shot region Sc2 of the third color filter, and the third shot region Sc3 of the third color filter may be provided in the display area (DA). Third border lines STL3 extending in the second direction (y) are provided at a border between the first shot region Sc1 of the third color filter and the second shot region Sc2 of the third color filter and a border between the second shot region Sc2 of the third color filter and the third shot region Sc3 of the third color filter. The widths of the first shot region Sc1 of the third color filter, the second shot region Sc2 of the third color filter, and the third shot region Sc3 of the third color filter may be equivalent to each other. In this instance, the width signifies a length in the first direction (x).

The first border line STL1, the second border line STL2, and the third border line STL3 may not overlap each other. A shortest distance d1 between the first border line STL1 and the second border line STL2, a shortest distance d2 between the first border line STL1 and the third border line STL3, and a shortest distance d3 between the second border line STL2 and the third border line STL3 may be equal to or greater than 30 mm. However, the distance between border lines is not limited thereto.

According to an exemplary embodiment, the first border line STL1, the second border line STL2, and the third border line STL3 do not overlap each other, so a stitch defect of which the stitch line is visible due to changes in luminance for respective regions may be substantially reduced compared to the case in which the first border line STL1, the second border line STL2, and the third border line STL3 overlap each other.

Figure 2:
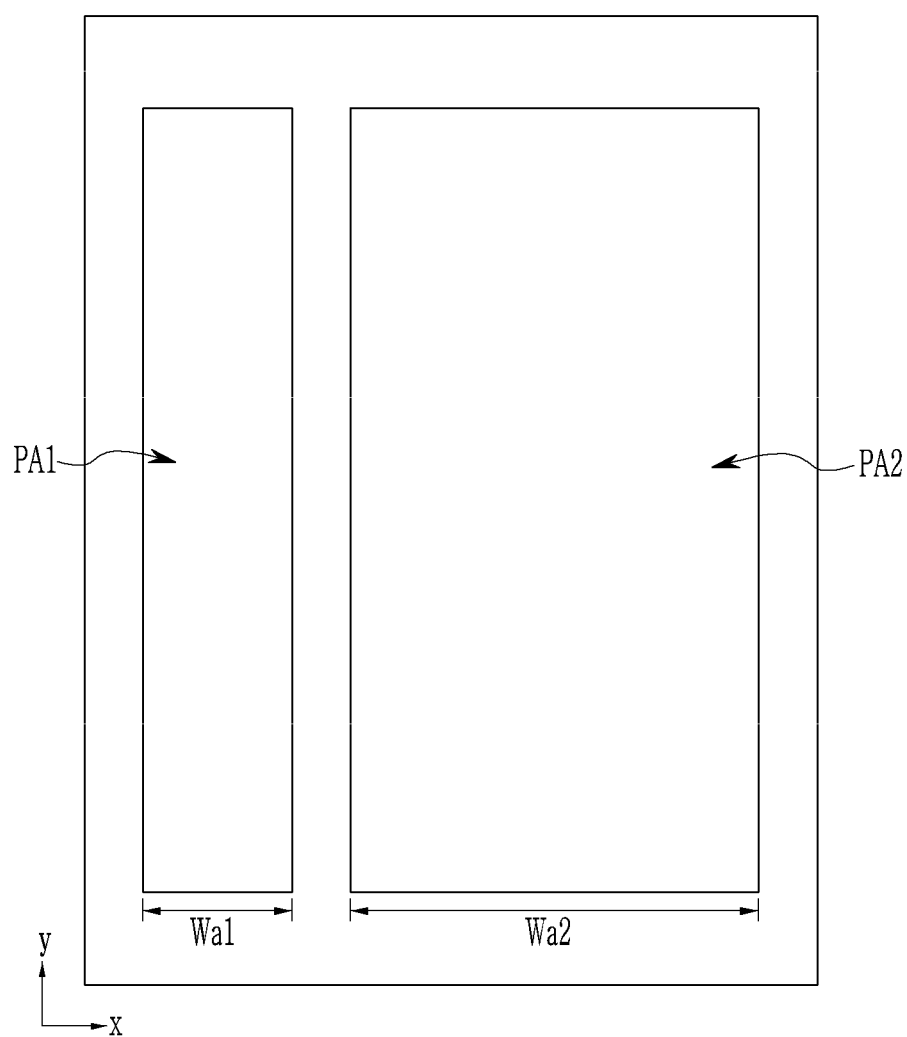
FIG. 2 shows a top plan view of a first mask according to an exemplary embodiment.
Figure 3:
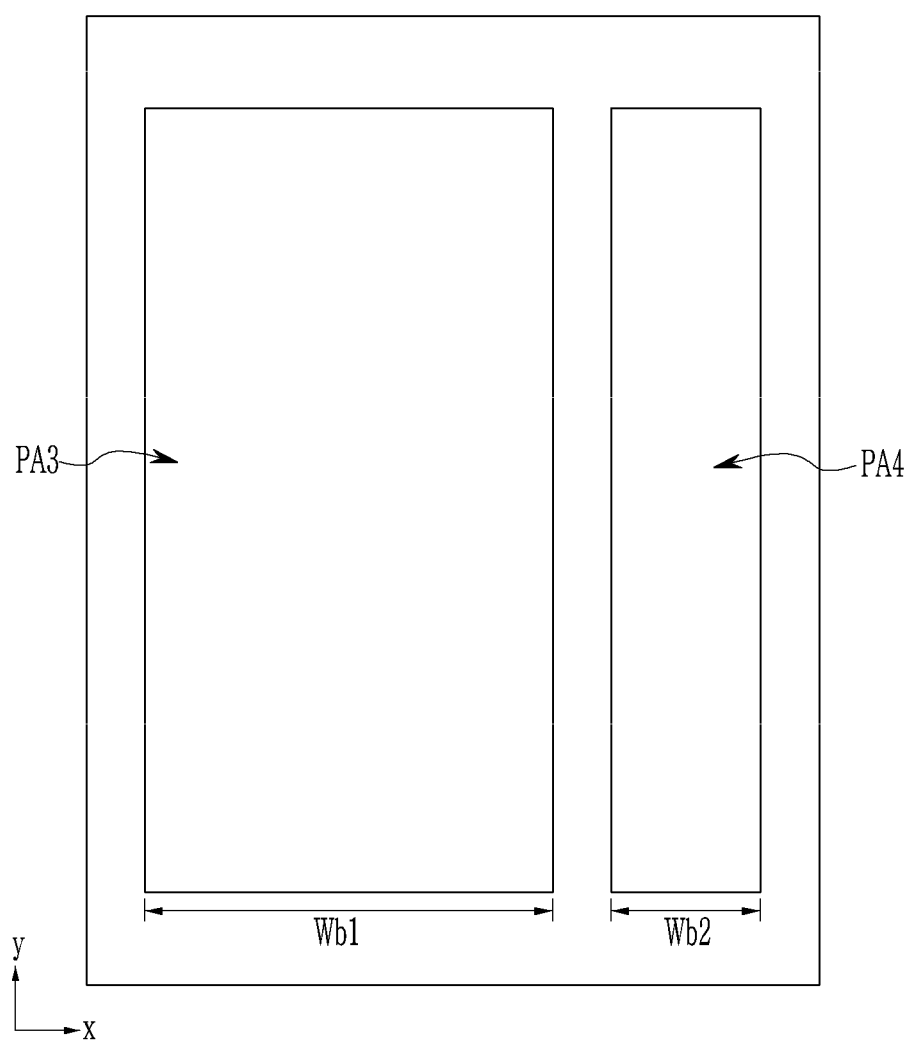
FIG. 3 shows a top plan view of a second mask according to an exemplary embodiment.
Figure 4:
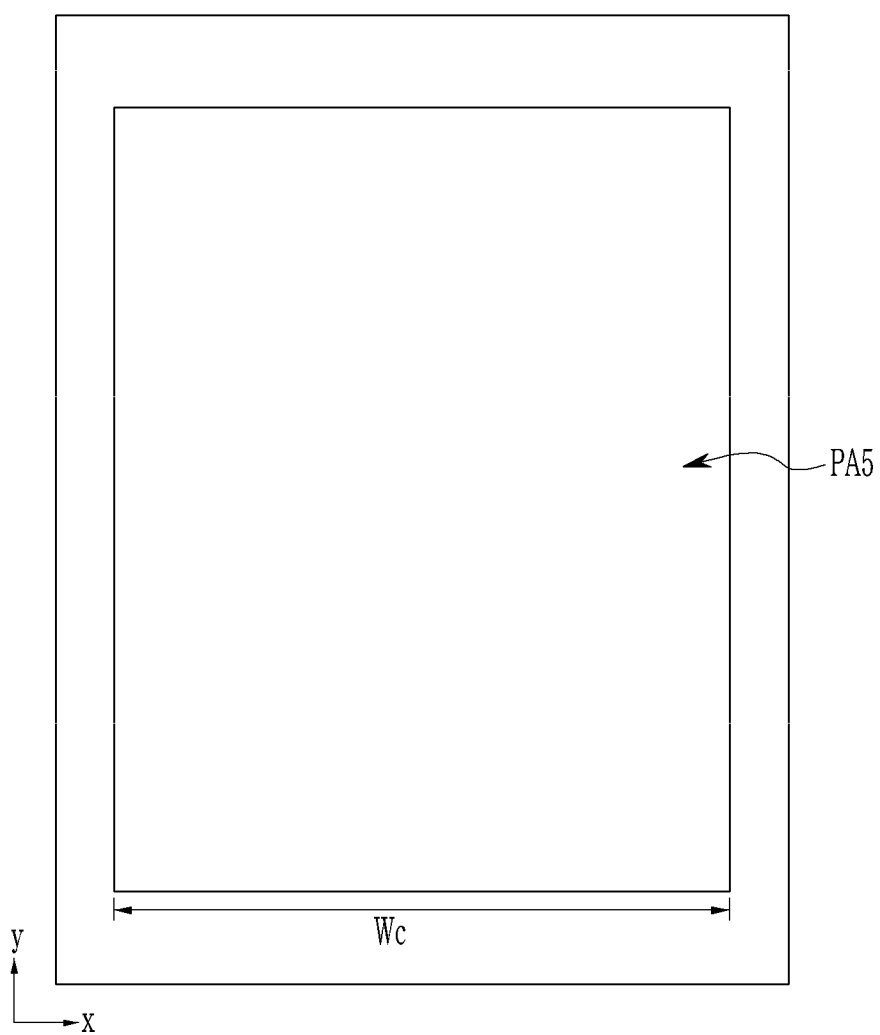
FIG. 4 shows a top plan view of a third mask according to an exemplary embodiment.

A mask according to an exemplary embodiment will now be described with reference to FIG. 2-FIG. 4. FIG. 2 shows a top plan view of a first mask 1001, FIG. 3 shows a top plan view of a second mask 1002, and FIG. 4 shows a top plan view of a third mask 1003.

The first mask 1001 is a first color filtering mask for exposing the first color filter 230a, the second mask 1002 is a second color filtering mask for exposing the second color filter 230b, and the third mask 1003 is a third color filtering mask for exposing the third color filter 230c.

Referring to FIG. 2, the first mask 1001 includes a first pattern area PA1 and a second pattern area PA2. The respective pattern areas PA1 and PA2 of the first mask 1001 signify areas where one shot is performed. The first pattern area PA1 and the second pattern area PA2 of the first mask 1001 include a blocking part which blocks lights and a transmitting part which transmits lights, and they may form various patterns on the display panel 300 by selectively transmitting or blocking light according to a shape of a desired pattern.

The first pattern area PA1 of the first mask 1001 includes a pattern corresponding to the first color filter pattern of the first shot region Sa1 of the first color filter in FIG. 1. The second pattern area PA2 of the first mask 1001 includes a pattern corresponding to the first color filter pattern of the second shot region Sa2, the third shot region Sa3, and the fourth shot region Sa4 of the first color filter in FIG. 1.

A width Wa1 of the first pattern area PA1 of the first mask 1001 may be different from a width Wa2 of the second pattern area PA2. The width Wa1 of the first pattern area PA1 may be less than the width Wa2 of the second pattern area PA2.

Referring to FIG. 3, the second mask 1002 includes a third pattern area PA3 and a fourth pattern area PA4. The respective pattern areas PA3 and PA4 of the second mask 1002 signify the areas where one shot is performed. The third pattern area PA3 and the fourth pattern area PA4 of the second mask 1002 include a blocking part which blocks lights and a transmitting part which transmits lights, and they may selectively transmit or block light according to a shape of a desired pattern and may form various patterns on the display panel 300.

The third pattern area PA3 of the second mask 1002 includes a pattern corresponding to the second color filter pattern of the first shot region Sb1, the second shot region Sb2, and the third shot region Sb3 of the second color filter in FIG. 1. The fourth pattern area PA4 of the second mask 1002 includes a pattern corresponding to the second color filter pattern of the fourth shot region Sb4 of the second color filter in FIG. 1.

The width Wb1 of the third pattern area PA3 of the second mask 1002 may be different from the width Wb2 of the fourth pattern area PA4. The width Wb1 of the third pattern area PA3 may be greater than the width Wb2 of the fourth pattern area PA4.

Referring to FIG. 4, the third mask 1003 includes a fifth pattern area PA5. The fifth pattern area PA5 of the third mask 1003 includes a blocking part which blocks lights and a transmitting part which transmits lights, and it may selectively transmit or block light according to a shape of a desired pattern and may form various patterns on the display panel 300.

The fifth pattern area PA5 of the third mask 1003 includes a pattern corresponding to the third color filter pattern of the first shot region Sc1, the second shot region Sc2, and the third shot region Sc3 of the third color filter in FIG. 1.

The width Wa1 of the first pattern area PA1 of the first mask 1001, the width Wb1 of the third pattern area PA3 of the second mask 1002, and the width Wc of the fifth pattern area PA5 of the third mask 1003 are different from each other. Further, a summation of the width Wa1 of the first pattern area PA1 of the first mask 1001 and the width Wa2 of the second pattern area PA2 is different from the width Wb1 of the third pattern area PA3 of the second mask 1002 and the width Wc of the fifth pattern area PA5 of the third mask 1003.

The width Wa2 of the second pattern area PA2 of the first mask 1001, the width Wb2 of the fourth pattern area PA4 of the second mask 1002, and the width Wc of the fifth pattern area PA5 of the third mask 1003 are different from each other. Further, a summation of the width Wb1 of the third pattern area PA3 of the second mask 1002 and the width Wb2 of the fourth pattern area PA4 is different from the width Wa2 of the second pattern area PA2 of the first mask 1001 and the width We of the fifth pattern area PA5 of the third mask 1003.

When the color filter 230 is formed by using masks 1001, 1002, and 1003 according to an exemplary embodiment, the first border line STL1 when the first color filter 230a is exposed, the second border line STL2 when the second color filter 230b is exposed, and the third border line STL3 when the third color filter 230c is exposed may not overlap each other. Further, the first border line STL1, the second border line STL2, and the third border line STL3 do not overlap each other, thereby preventing the stitch defect in which the respective border lines are visible to a user.

A method for manufacturing a display device according to an exemplary embodiment will now be described with reference to FIG. 1 to FIG. 4. A method for exposing a first color filter 230a, a second color filter 230b, and a third color filter 230c will now be described.

The first shot region Sa1 of the first color filter is exposed with a first shot by using the first pattern area PA1 of the first mask 1001, and the second shot region Sa2, the third shot region Sa3, and the fourth shot region Sa4 of the first color filter are exposed with a second shot, a third shot, and a fourth shot by using the second pattern area PA2 of the first mask 1001. It has been described that three shots were performed with the second pattern area PA2 of the first mask 1001, and the number of shots is not limited thereto. That is, it is possible to perform two shots or at least four shots with the second pattern area PA2 of the first mask 1001.

The first shot region Sb1 of the second color filter, the second shot region Sb2 of the second color filter, and the third shot region Sb3 of the second color filter are exposed with a first shot, a second shot, and a third shot by using the third pattern area PA3 of the second mask 1002, and the fourth shot region Sb4 of the second color filter is exposed with a fourth shot by using the fourth pattern area PA4 of the second mask 1002. It has been described that three shots were performed with the third pattern area PA3 of the second mask 1002, and the number of shots is not limited thereto. For example, it is possible to perform two shots or at least four shots with the third pattern area PA3 of the second mask 1002.

The first shot region Sc1 of the third color filter, the second shot region Sc2 of the third color filter, and the third shot region Sc3 of the third color filter are exposed with a first shot, a second shot, and a third shot by using the fifth pattern area PA5 of the third mask 1003. It has been described that three shots were performed with the fifth pattern area PA5 of the third mask 1003, and the number of shots is not limited thereto. For example, it is possible to perform two shots or at least four shots with the fifth pattern area PA5 of the third mask 1003.

Figure 5:
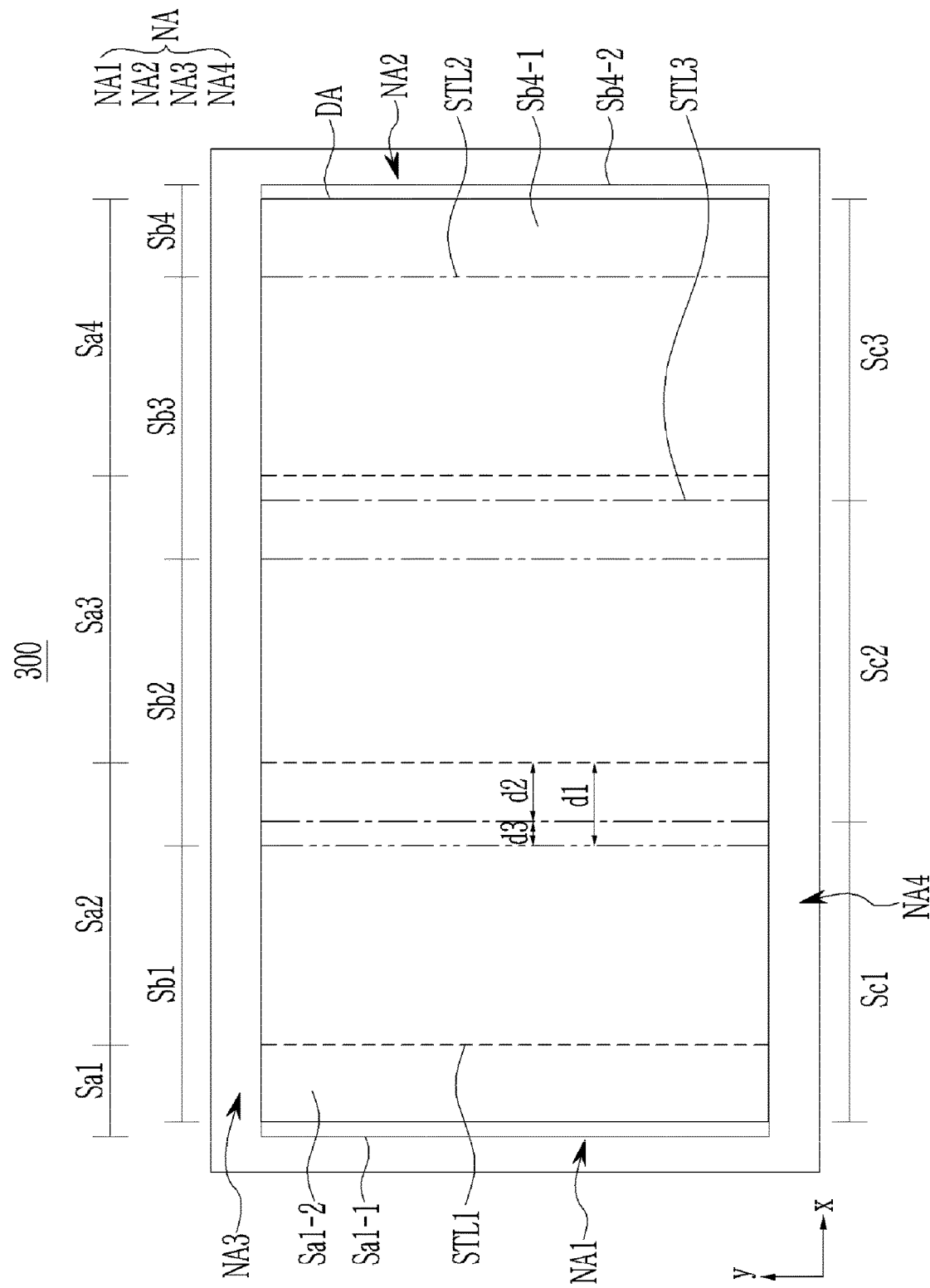
FIG. 5 shows a schematic diagram of a shot region of a display device according to an exemplary embodiment.

A display device according to an exemplary embodiment will now be described with reference to FIG. 5. FIG. 5 shows a schematic diagram of a shot region of a display device according to an exemplary embodiment. The schematic diagram shown in FIG. 5 is similar to that shown with reference to FIG. 1 except for the first shot region Sa1 of the first color filter and the fourth shot region Sb4 of the second color filter, so no detailed description on the same content will be provided.

Referring to FIG. 5, the first shot region Sa1 of the first color filter and the fourth shot region Sb4 of the third color filter are also provided in the non-display area (NA). In other words, the first shot region Sa1 of the first color filter includes a first non-display shot region (Sa1-1) provided in the first non-display area NA1 and a first display shot region (Sa1-2) provided in the display area (DA). The fourth shot region Sb4 of the second color filter includes a second non-display shot region (Sb4-2) provided in the second non-display area NA2 and a second display shot region (Sb4-1) provided in the display area (DA).

Therefore, the first color filter pattern may be provided in the first non-display area NA1 and not the second color filter pattern and the third color filter pattern. Further, the second color filter pattern may be provided in the second non-display area NA2 and not the first color filter pattern and the third color filter pattern.

Figure 6:
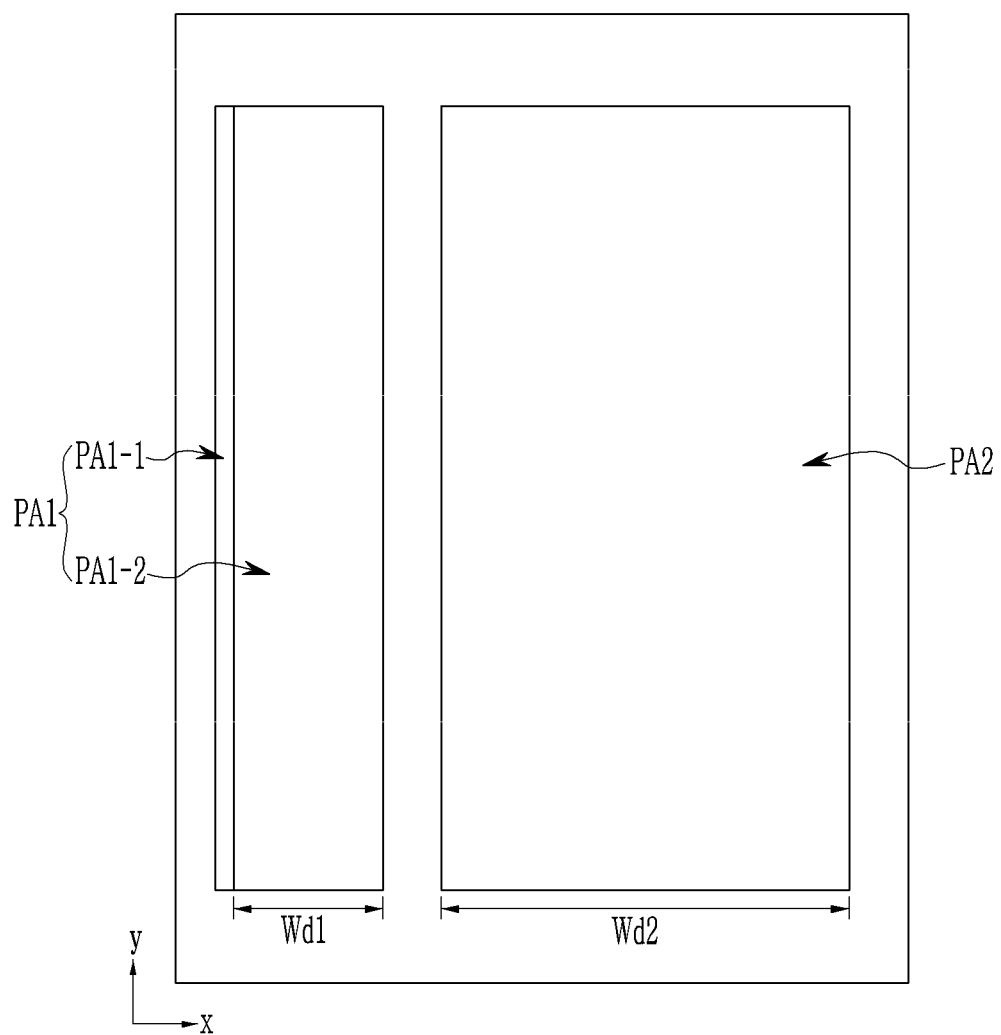
FIG. 6 shows a top plan view of a first mask according to an exemplary embodiment.
Figure 7:
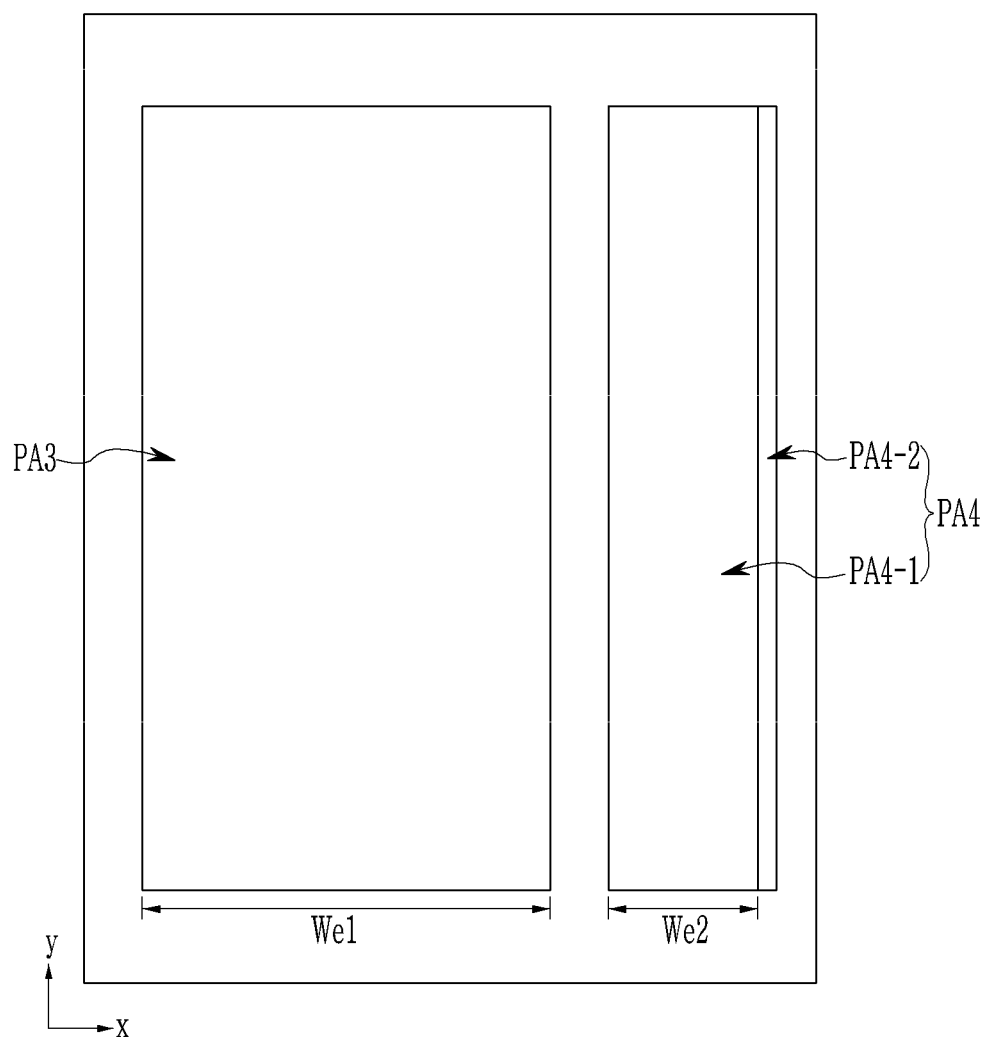
FIG. 7 shows a top plan view of a second mask according to an exemplary embodiment.
Figure 8:
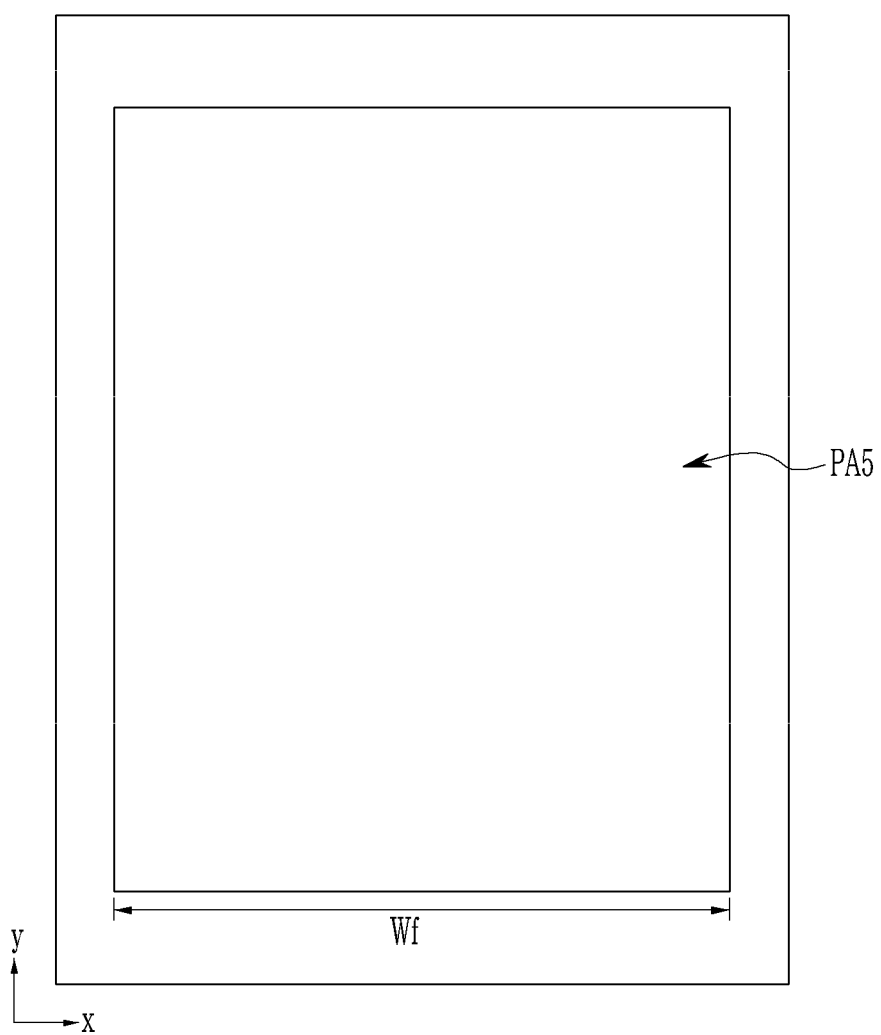
FIG. 8 shows a top plan view of a third mask according to an exemplary embodiment.

A mask according to an exemplary embodiment will now be described with reference to FIG. 6-FIG. 8. FIG. 6 shows a top plan view of a first mask 2001, FIG. 7 shows a top plan view of a second mask 2002, and FIG. 8 shows a top plan view of a third mask 2003.

Referring to FIG. 6, the first mask 2001 includes a first pattern area PA1 and a second pattern area PA2. The first pattern area PA1 includes a first non-display pattern area (PA1-1) and a first display pattern area (PA1-2). The first non-display pattern area (PA1-1) and the first display pattern area (PA1-2) represent areas in which one shot is performed.

The first pattern area PA1 of the first mask 2001 includes a pattern corresponding to a first color filter pattern of the first shot region Sa1 of the first color filter in FIG. 5. The second pattern area PA2 of the first mask 2001 includes a pattern corresponding to a first color filter pattern of the second shot region Sa2, the third shot region Sa3, and the fourth shot region Sa4 of the first color filter in FIG. 5.

The first non-display pattern area (PA1-1) of the first pattern area PA1 includes a pattern corresponding to a first color filter pattern provided in the first non-display shot region (Sa1-1) in FIG. 5, and the first display pattern area (PA1-2) includes a pattern corresponding to a first color filter pattern of the first display shot region (Sa1-2).

A width Wd1 of the first display pattern area (PA1-2) of the first mask 2001 may be different from a width Wd2 of the second pattern area PA2. The width Wd1 of the first display pattern area (PA1-2) may be less than the width Wd2 of the second pattern area PA2.

Referring to FIG. 7, the second mask 2002 includes a third pattern area PA3 and a fourth pattern area PA4. The fourth pattern area PA4 includes a second display pattern area (PA4-1) and a second non-display pattern area (PA4-2). The second display pattern area (PA4-1) and the second non-display pattern area (PA4-2) represent areas in which one shot is performed.

The third pattern area PA3 of the second mask 2002 includes a pattern corresponding to a second color filter pattern of the first shot region Sb1, the second shot region Sb2, and the third shot region Sb3 of the second color filter in FIG. 5. The fourth pattern area PA4 of the second mask 2002 includes a pattern corresponding to a second color filter pattern of the fourth shot region Sb4 of the second color filter in FIG. 5.

The second non-display pattern area (PA4-2) of the fourth pattern area PA4 includes a pattern corresponding to a second color filter pattern provided in the second non-display shot region (Sb4-2) in FIG. 5, and the second display pattern area (PA4-1) includes a pattern corresponding to a second color filter pattern of the second display shot region (Sb4-1).

A width We2 of the second display pattern area (PA4-1) of the second mask 2002 may be different from a width We1 of the third pattern area PA3. A width We2 of the second display pattern area (PA4-1) may be less than a width We1 of the third pattern area PA3.

Referring to FIG. 8, the third mask 2003 includes a fifth pattern area PA5. The fifth pattern area PA5 of the third mask 2003 includes a pattern corresponding to a third color filter pattern of the first shot region Sc1, the second shot region Sc2, and the third shot region Sc3 of the third color filter in FIG. 5.

The width Wd1 of the first display pattern area (PA1-2) of the first mask 2001, the width We1 of the third pattern area PA3 of the second mask 2002, and the width (Wf) of the fifth pattern area PA5 of the third mask 2003 are different from each other. Further, a summation of the width Wd1 of the first display pattern area (PA1-2) of the first mask 2001 and the width Wd2 of the second pattern area PA2 is different from the width We1 of the third pattern area PA3 of the second mask 2002 and the width Wf of the fifth pattern area PA5 of the third mask 2003.

The width Wd2 of the second pattern area PA2 of the first mask 2001, the width We2 of the second display pattern area (PA4-1) of the second mask 2002, and the width Wf of the fifth pattern area PA5 of the third mask 2003 are different from each other. Further, a summation of the width We1 of the third pattern area PA3 of the second mask 2002 and the width We2 of the second display pattern area (PA4-1) is different from the width Wd2 of the second pattern area PA2 of the first mask 2001 and the width Wf of the fifth pattern area PA5 of the third mask 2003.

The first mask 2001 according to an exemplary embodiment includes a first non-display pattern area (PA1-1) on a first side of the first pattern area PA1, and the second mask 2002 includes a second non-display pattern area (PA4-2) on a first side of the fourth pattern area PA4, so it is possible to additionally form a first color filter pattern and a second color filter pattern in the first non-display area NA1 and the second non-display area NA2. Further, the pattern area may become larger than the case in which one mask includes pattern areas of the first non-display area NA1 and the second non-display area NA2, so the number of shots may be reduced or minimized, and the patterns of the first color filter and the second color filter may be formed in the respective non-display areas NA1 and NA2.

A method for manufacturing a display device according to an exemplary embodiment will now be described with reference to FIG. 5 to FIG. 8. In detail, a method for exposing a first color filter 230a, a second color filter 230b, and a third color filter 230c will now be described.

The first shot region Sa1 of the first color filter is exposed with a first shot by using the first pattern area PA1 including a first non-display pattern area (PA1-1) and a first display pattern area (PA1-2) of the first mask 2001, and the second shot region Sa2, the third shot region Sa3, and the fourth shot region Sa4 of the first color filter are exposed with a second shot, a third shot, and a fourth shot by using the second pattern area PA2 of the first mask 2001. It has been described that three shots are performed with the second pattern area PA2 of the first mask 2001, and the number of shots is not limited thereto.

The first shot region Sb1, the second shot region Sb2, and the third shot region Sb3 of the second color filter are exposed with a first shot, a second shot, and a third shot by using the third pattern area PA3 of the second mask 2002, and the fourth shot region Sb4 of the second color filter is exposed with a fourth shot by using a second display pattern area (PA4-1) and a second non-display pattern area (PA4-2) of the second mask 2002. It has been described that three shots were performed with the third pattern area PA3 of the second mask 2002, and the number of shots is not limited thereto.

The first shot region Sc1, the second shot region Sc2, and the third shot region Sc3 of the third color filter are exposed with a first shot, a second shot, and a third shot by using a fifth pattern area PA5 of the third mask 2003. It has been described that three shots were performed with the fifth pattern area PA5 of the third mask 1003, and the number of shots is not limited thereto. For example, it is possible to perform two shots or at least four shots with the fifth pattern area PA5 of the third mask 1003.

Figure 9:
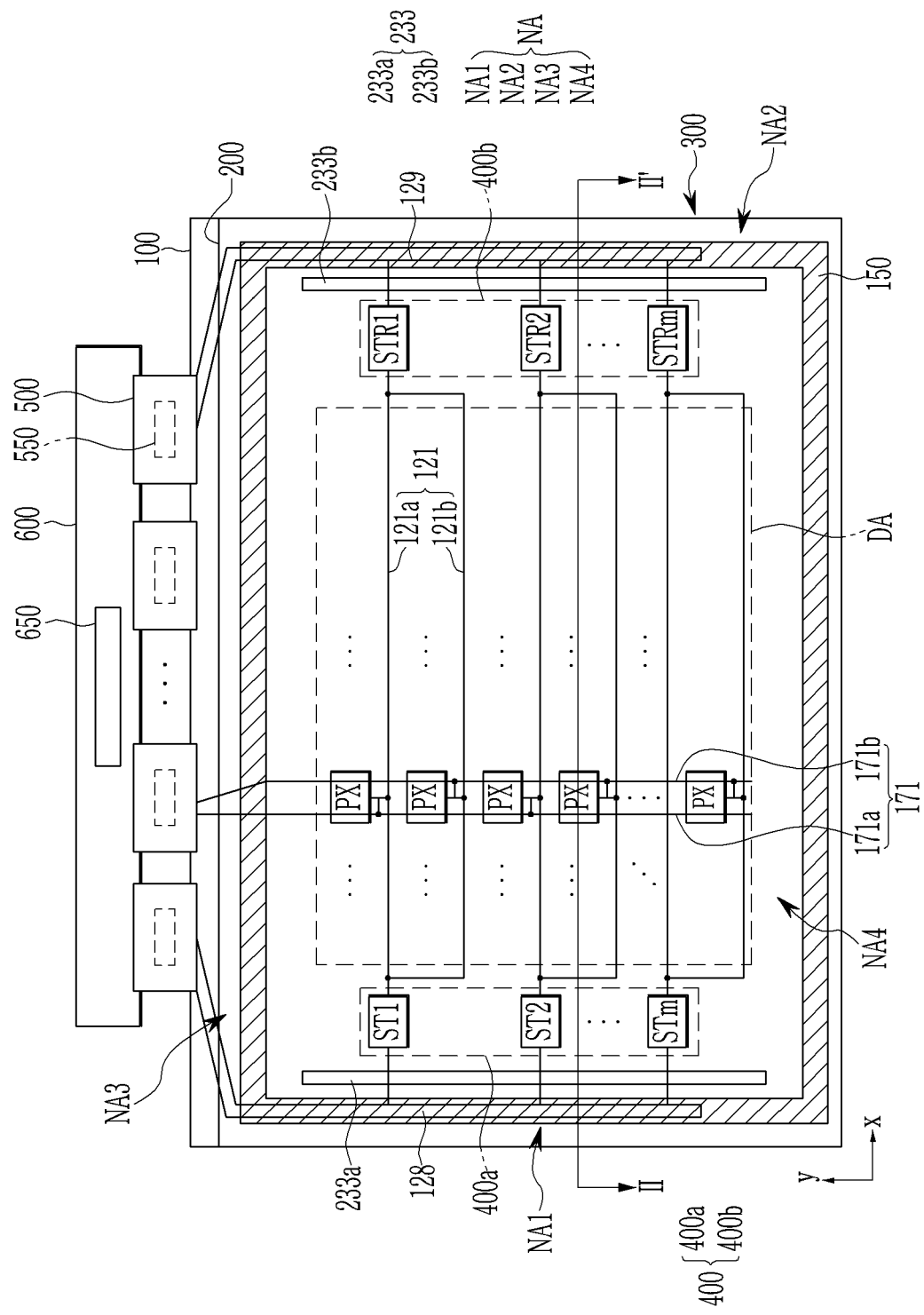
FIG. 9 shows a top plan view of a display device according to an exemplary embodiment.
Figure 10:
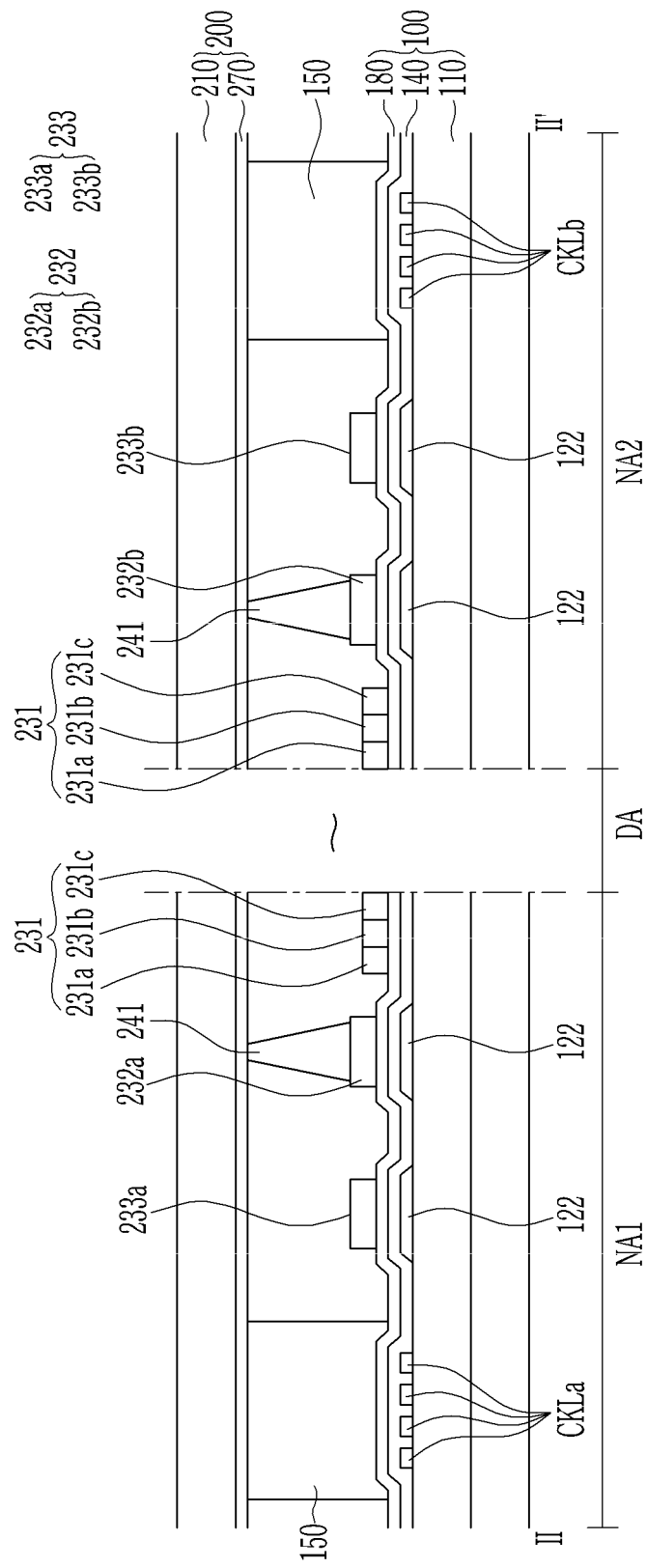
FIG. 10 shows a cross-sectional view with respect to the line II-II' of FIG. 9.

A display device according to an exemplary embodiment will now be described with reference to FIG. 9 and FIG. 10. FIG. 9 shows a top plan view of a display device according to an exemplary embodiment, and FIG. 10 shows a cross-sectional view with respect to the line II-II' of FIG. 9.

The display device according to an exemplary embodiment includes a display panel 300, a flexible printed circuit board 500, and a printed circuit board (PCB) 600.

The display panel 300 may be a display panel included various kinds of display devices such as a liquid crystal display (LCD) or an organic light emitting display (OLED). The display device will exemplify a liquid crystal display.

The display panel 300 includes a display area (DA) for displaying an image, and a non-display area (NA) that is a residual region thereof. The non-display area (NA) includes a first non-display area NA1 and a second non-display area NA2 with a display area (DA) provided therebetween with respect to the first direction (x), and includes a third non-display area NA3 and a fourth non-display area NA4 with the display area (DA) provided therebetween with respect to the second direction (y).

A plurality of gate lines 121, a plurality of data lines 171, and a plurality of pixels PX connected to the gate lines 121 and the data lines 171 are provided in the display area (DA).

The gate lines 121 transmit gate signals, and they may substantially extend in the first direction (x) and may be substantially parallel to each other. One gate line 121 for transmitting one gate signal may include a first sub-gate line 121a and second sub-gate line 121b electrically connected to each other. The sub-gate lines 121a and 121b may extend in the first direction (x), and may be arranged in parallel to each other along the second direction (y) in the display area (DA). The first and second sub-gate lines 121a and 121b included in one gate line 121 may be provided in different pixel rows, and may be electrically connected to transistors of the pixels PX of the corresponding pixel row. The first and second sub-gate lines 121a and 121b included in one gate line 121 may be physically and electrically connected to each other around right and left edges of the display area (DA) or in the non-display area (NA) to transmit the same gate signal.

The data lines 171 may transmit a data voltage corresponding to an image signal, may extend in the second direction (y) traversing the first direction, and may be parallel to each other. A pair of data lines 171a and 171b may be disposed in the respective corresponding pixel arrays, and the one pair of data lines 171 may include a first data line 171a and a second data line 171b. The first data line 171a and the second data line 171b may be alternately arranged in parallel to the first direction (x). The first data line 171a and the second data line 171b corresponding to one pixel array may traverse the inside of the pixel area of the pixels PX of the corresponding pixel array and may overlap the pixel area. For example, the first data line 171a and the second data line 171b may pass through the inside of one transmission region defined for the respective pixels PX of the corresponding pixel array. The first data line 171a and the second data line 171b corresponding to one pixel array may transmit independent data voltages.

The first data line 171a and the second data line 171b corresponding to one pixel array are electrically connected to the transistor of the pixels PX provided in the corresponding pixel array. Particularly, transistors of two pixels PX including transistors electrically connected to the first and second sub-gate lines 121a and 121bs of one gate line 121 in one pixel array are electrically connected to a different data line 171 from among the first data line 171a and the second data line 171b. Therefore, the different pixels PX connected to one gate line 121 may receive data voltages corresponding to the same through the first data line 171a and the second data line 171b at a same time (e.g., an identical time) in one pixel array. For example, as shown in FIG. 9, transistors of the pixels PX arranged in parallel to the second direction (y) in the respective pixel arrays may be alternately electrically connected to the first data line 171a and the second data line 171b.

As described, the number of gate lines 121 may be reduced to substantially half the number of the entire pixel rows, and the number of data lines 171 may be double the number of the pixel arrays on the display panel 300 including the pixels PX disposed in a matrix form.

A sealant 150 is provided in the non-display area (NA). The sealant 150 may be provided to surround the display area (DA) in the non-display area (NA). Further, the sealant 150 may be provided to surround at least part of the non-display area (NA).

A first control signal line 128, a second control signal line 129, and a gate driver 400 connected thereto are provided in the non-display area (NA). Further, the gate line 121 and the data line 171 of the display area (DA) may be provided to extend from the display area (DA) in the non-display area (NA).

The first control signal line 128 extends in the second direction (y) in the first non-display area NA1, and the second control signal line 129 extends in the second direction (y) in the second non-display area NA2. The first control signal line 128 and the second control signal line 129 may be provided to overlap the sealant 150. However, without being limited to this exemplary embodiment, they may partly overlap the sealant 150 or they may not overlap the sealant 150. The first control signal line 128 and the second control signal line 129 may include a plurality of clock signal lines (CKLa, CKLb), a low voltage line for transmitting a low voltage, and a scanning start signal line for transmitting a scanning start signal.

The gate driver 400 may be connected to the gate line 121 and may transmit the gate signal (Gn) to the gate line 121. The gate driver 400 may be formed in the non-display area (NA) of the display panel 300 through a same process (e.g., an identical process) together with electrical elements such as a thin film transistor of the display area (DA). The gate driver 400 may include a first gate driver 400a provided in the first non-display area NA1 and a second gate driver 400b provided in the second non-display area NA2.

The first gate driver 400a is connected to a plurality of first control signal lines 128 to receive clock signals, and the second gate driver 400b is connected to a plurality of second control signal lines 129 to receive clock signals.

The first gate driver 400a includes a plurality of first stages (ST1-STm) (where m is a natural number) arranged in series in the second direction (y) in a left region of the display panel 300, and the second gate driver 400b includes a plurality of second stages (STR1-STRm) (where m is a natural number) arranged in series in the second direction (y) in a right region of the display panel 300.

The stages, corresponding to each other, of the first gate driver 400a and the second gate driver 400b, may be connected to the gate line 121 and may apply a gate signal. As described, when the gate signal is applied to the gate line 121 on respective sides of the display panel 300, a displaying defect caused by a delay of the gate signal may be prevented even when the display panel 300 becomes larger.

The first stages (ST1-STm) are dependently connected to each other, and they may generate gate signals and may sequentially transmit the gate signals to the gate line 121. The second stages (STR1-STRm) are dependently connected to each other, and they may generate gate signals and may sequentially transmit the gate signals to the gate line 121. The first stages (ST1-STm) and the second stages (STR1-STRm) may include gate signal output terminals connected to the respective gate lines 121 and outputting gate signals.

The stages (ST1-STm and STR1-STRm) may include active elements such as a plurality of transistors or diodes integrated in the non-display area (NA) of the display panel 300 and passive elements such as capacitors. The active elements or the passive element included by the stages (ST1-STm and STR1-STRm) may be manufactured in a same manufacturing stage as the transistor included by the pixel PX of the display area (DA).

It has been described in FIG. 9 that a plurality of first stages (ST1-STm) are provided in the first non-display area NA1 and the second stages (STR1-STRm) are provided in the second non-display area NA2, and without being limited to this exemplary embodiment, they may be provided anywhere in the non-display area (NA). Further, one of the first gate driver 400a and the second gate driver 400b may be omitted depending on exemplary embodiments.

A color filter dam 233 is provided in the non-display area (NA). The color filter dam 233 includes a first color filter dam 233a provided in the first non-display area NA1 and a second color filter dam 233b provided in the second non-display area NA2.

The first color filter dam 233a extends in the second direction (y) between the sealant 150 provided in the first non-display area NA1 and the display area (DA). The second color filter dam 233b extends in the second direction (y) between the sealant 150 provided in the second non-display area NA2 and the display area (DA). The color filter dam 233 prevents the sealant 150 from overflowing to the display area (DA) between the sealant 150 and the display area (DA). Further, the color filter dam 233 may prevent the sealant 150 from detaching by preventing an alignment layer 11 (e.g., refer to FIG. 15) of the display area (DA) from permeating into a lower portion of the sealant 150.

The first color filter dam 233a includes a material that is the same as one of the first color filter 230a, the second color filter 230b, and the third color filter 230c of the display area (DA), and the second color filter dam 233b includes a material that is the same as another thereof. That is, the first color filter dam 233a and the second color filter dam 233b include different color filter materials. For example, the first color filter dam 233a may include the same material as the first color filter 230a, and the second color filter dam 233b may include the same material as the second color filter 230b.

The flexible printed circuit board 500 may be bent, and a first end of the flexible printed circuit board 500 is electrically connected to a first control signal line 128, a second control signal line 129, and a data line 171 of the display panel 300 in the non-display area (NA) of the display panel 300. The flexible printed circuit board 500 includes a data driver IC 550 for generating a data voltage that is a gray voltage corresponding to an input image signal.

The printed circuit board (PCB) 600 is electrically connected to a second end of the flexible printed circuit board 500. The printed circuit board (PCB) 600 includes a signal controller 650 for controlling a data driver IC 550 and a gate driver 400. The signal controller 650 receives an input image signal and an input control signal for controlling displaying of the input image signal from an external graphics controller. The signal controller 650 is provided on the printed circuit board (PCB) 600, and it may transmit signals to the display panel 300 through the flexible printed circuit board 500.

Referring to FIG. 10, the display panel 300 of the display device includes a lower panel 100 and an upper panel 200 facing each other, and a liquid crystal layer 3 provided between the lower panel 100 and the upper panel 200.

The lower panel 100 will now be described. The lower panel 100 includes a first substrate 110, and a gate conductive layer is provided on the first substrate 110. The gate conductive layer includes a first clock signal line (CKLa), a second clock signal line (CKLb), and a first wiring layer 122 provided in the non-display area (NA). The first wiring layer 122 may be a wire provided on the first stages (ST1-STm) and the second stages (STR1-STRm) of FIG. 9, or it may be a wire for connecting the stages (ST1-STm and STR1-STRm) and control signal lines 128 and 129. FIG. 10 shows a typical first clock signal line (CKLa) and second clock signal line (CKLb) of the first control signal line 128 and the second control signal line 129 of FIG. 9. Four first clock signal lines (CKLa) and four second clock signal lines (CKLb) are illustrated, but the number of signal lines is not limited thereto.

A gate insulating layer 140 and an inorganic insulating layer 180 are provided on the gate conductive layer.

A sealant 150, a dummy color filter 231, a support pattern 232, and a color filter dam 233 are provided on the inorganic insulating layer 180.

The sealant 150 bonds the lower panel 100 and the upper panel 200 facing the same. The sealant 150 may prevent the liquid crystal material of the liquid crystal layer from being drawn outside the display panel 300 or impurities such as moisture or oxygen from permeating into the liquid crystal layer from the outside.

The dummy color filter 231 is provided adjacent to the display area (DA) in the non-display area (NA). The dummy color filter 231 includes a first dummy color filter 231a, a second dummy color filter 231b, and a third dummy color filter 231c. The first dummy color filter 231a includes the same material as the first color filter 230a of the display area (DA), the second dummy color filter 231b includes the same material as the second color filter 230b of the display area (DA), and the third dummy color filter 231c includes the same material as the third color filter 230c of the display area (DA).

The support pattern 232 includes a first support pattern 232a provided in the first non-display area NA1 and a second support pattern 232b provided in the second non-display area NA2. The support pattern 232 may overlap the first wiring layer 122. A spacer 241 is provided on the support pattern 232. The spacer 241 may contact the lower panel 100 and the upper panel 200, and may prevent the upper panel 200 from drooping in the non-display area (NA). Further, the spacer 241 may support the upper panel 200 to prevent a short-circuit defect of the lower panel 100.

The support pattern 232 is provided below the spacer 241 so that it may function as a main spacer when the spacer 241 is not formed to be tall.

The first support pattern 232a may include the same material as one of the first color filter 230a, the second color filter 230b, and the third color filter 230c of the display area (DA), and the second support pattern 232b may include the same material as another thereof. For example, the first support pattern 232a may include the same material as the first color filter 230a, and the second support pattern 232b may include the same material as the second color filter 230b.

The color filter dam 233 includes a first color filter dam 233a provided in the first non-display area NA1 and a second color filter dam 233b provided in the second non-display area NA2. The color filter dam 233 may overlap the first wiring layer 122.

The first color filter dam 233a may include the same material as one of the first color filter 230a, the second color filter 230b, and the third color filter 230c of the display area (DA), and the second color filter dam 233b may include the same material as another thereof. For example, the first color filter dam 233a may include the same material as the first color filter 230a, and the second color filter dam 233b may include the same material as the second color filter 230b.

In this instance, the first color filter 230a may be a red color filter, and the second color filter 230b may be a green color filter. When the blue color filter is formed to be relatively thick, and the first color filter dam 233a and the second color filter dam 233b are formed by using a red color filter and a green color filter that have a substantially identical height, the heights of the color filter dams 233 on respective sides may be formed to be substantially the same. However, without being limited to this, the first color filter dam 233a and the second color filter dam 233b may include the same material as the blue color filter.

The first support pattern 232a and the first color filter dam 233a may include the same color filter material, and the second support pattern 232b and the second color filter dam 233b may include the same color filter material.

In this instance, the first support pattern 232a and the first color filter dam 233a may correspond to a first color filter pattern provided in the first non-display shot region (Sa1-1) of FIG. 5, and the second support pattern 232b and the second color filter dam 233b may correspond to a second color filter pattern provided in the second non-display shot region (Sb4-2) of FIG. 5.

The upper panel 200 includes a common electrode 270 provided on the second substrate 210 and the second substrate 210 and transmitting a common voltage Vcom.

Figure 11:
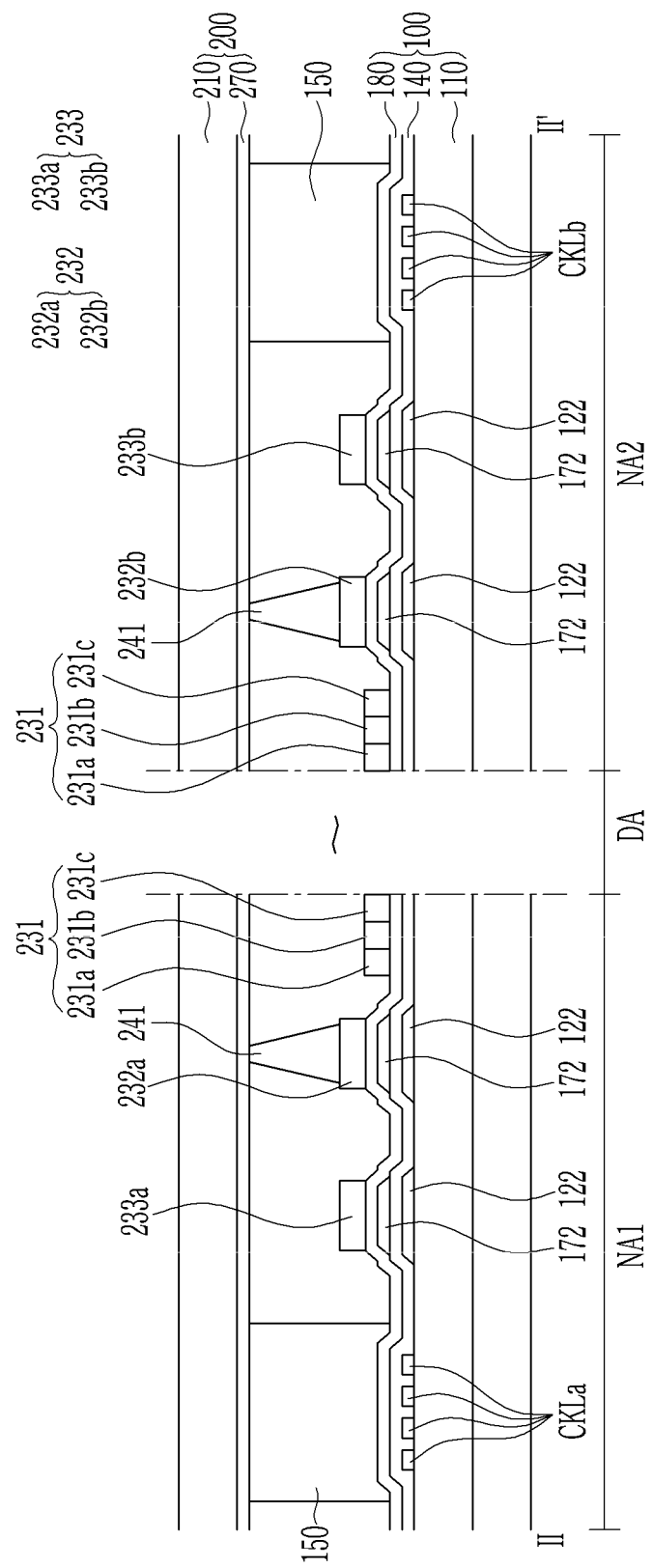
FIG. 11 shows a cross-sectional view of a display device according to an exemplary embodiment.

A display device according to an exemplary embodiment will now be described with reference to FIG. 11. Differing from FIG. 10, the display device of FIG. 11 includes a data conductive layer provided between the gate insulating layer 140 and the inorganic insulating layer 180.

The data conductive layer includes a second wiring layer 172. The second wiring layer 172 may be a wire provided on the first stages (ST1-STm) and the second stages (STR1-STRm) of FIG. 9, or it may be a wire for connecting the stages (ST1-STm and STR1-STRm) and the control signal lines 128 and 129.

The color filter dam 233 may overlap the first wiring layer 122 and the second wiring layer 172, and the support pattern 232 may overlap the first wiring layer 122 and the second wiring layer 172.

Figure 12:
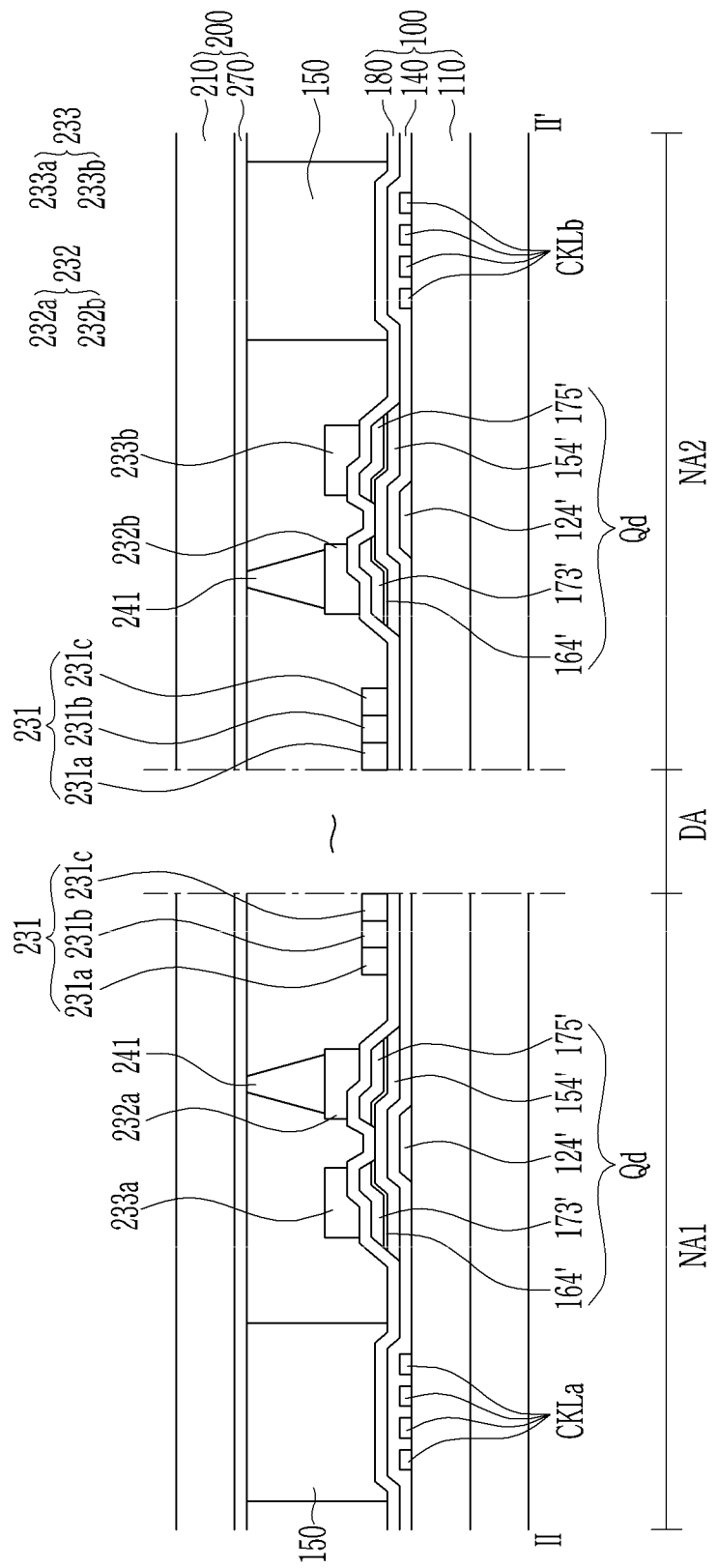
FIG. 12 shows a cross-sectional view of a display device according to an exemplary embodiment.

A display device according to an exemplary embodiment will now be described with reference to FIG. 12. The display device of FIG. 12 includes a driver transistor Qd. The driver transistor Qd may be a switching element included in the stages (ST1-STm and STR1-STRm) of the gate driver 400 of FIG. 9. The driver transistor Qd includes a driver gate electrode 124', a driver semiconductor layer 154', an ohmic contact 164', a driver source electrode 173', and a driver drain electrode 175'.

The color filter dam 233 and the support pattern 232 may overlap the driver transistor Qd.

Figure 13:
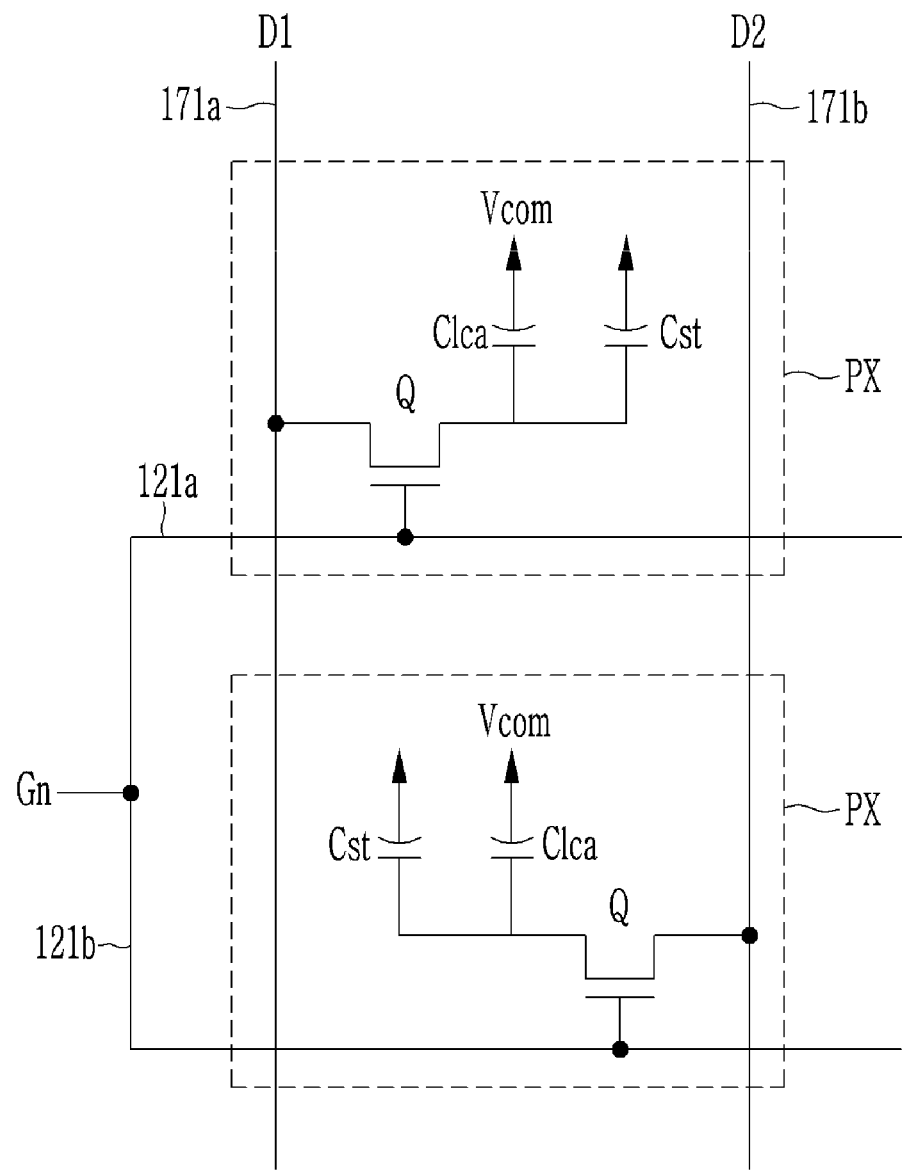
FIG. 13 shows an equivalent circuit diagram of two pixels of a display device according to an exemplary embodiment.

A display area (DA) of a display device according to an exemplary embodiment will now be described with reference to FIG. 13 to FIG. 17. FIG. 13 shows an equivalent circuit diagram of two pixels PX of a display device according to an exemplary embodiment.

The pixel PX includes a transistor Q connected to one data line 171 and one gate line 121, and a liquid crystal capacitor (Clca) and a storage capacitor Cst connected to the transistor Q.

The transistor Q includes a gate electrode connected to the gate line 121, a first electrode connected to the data line 171, and a second electrode connected to a first electrode of the liquid crystal capacitor (Clca). A second electrode of the transistor Q is connected to a first electrode of the storage capacitor Cst.

The liquid crystal capacitor (Clca) includes a first electrode connected to a second electrode of the transistor Q and a second electrode for receiving a common voltage.

The storage capacitor Cst includes a first electrode connected to the second electrode of the transistor Q and a second electrode for receiving a storage voltage. The storage capacitor Cst may maintain the voltage applied to the second electrode of the transistor Q, and the pixel electrode 191 connected thereto when the data voltage is not applied to the data line 171.

Figure 14:
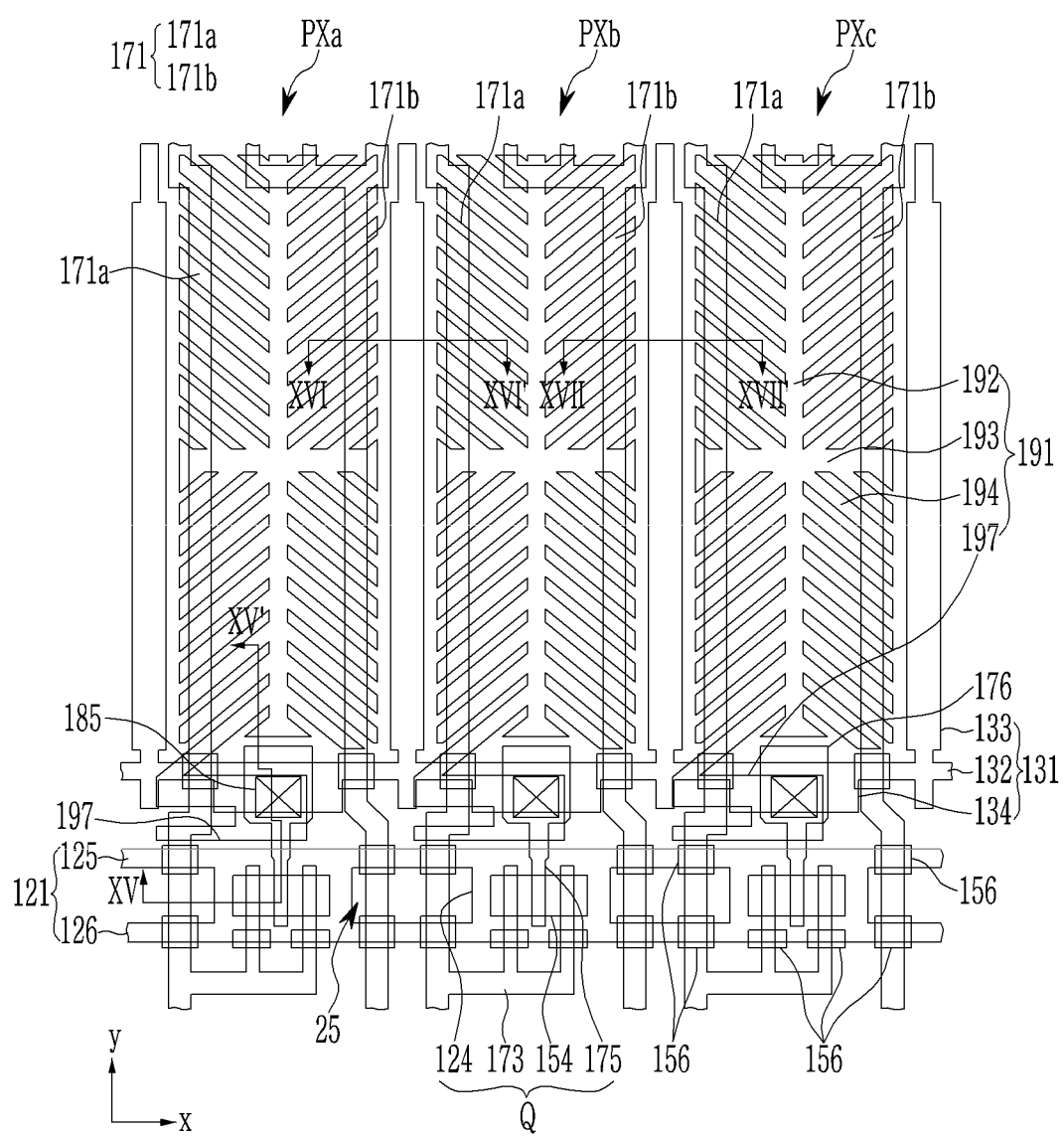
FIG. 14 shows a plan layout view of three pixels of a display device according to an exemplary embodiment.
Figure 15:
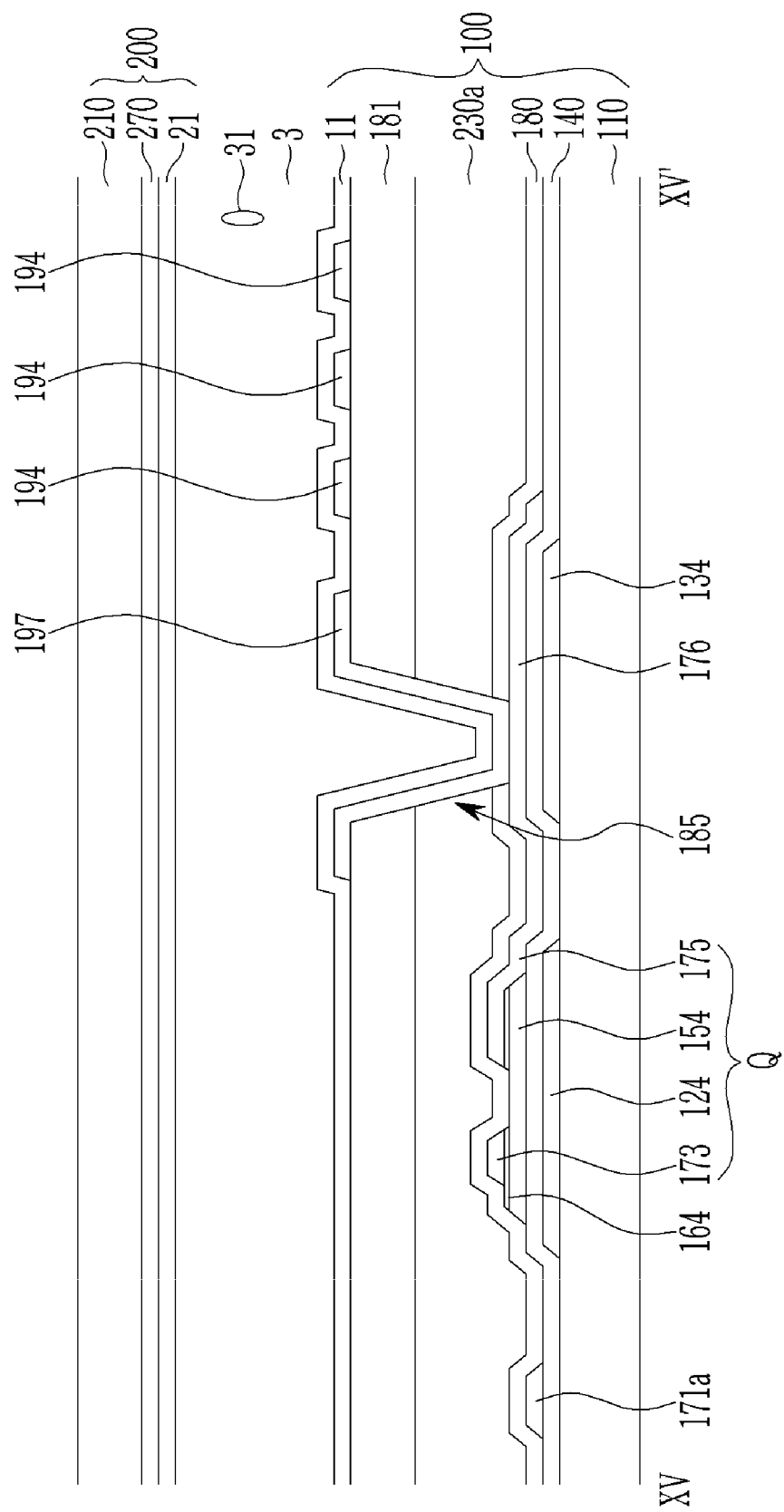
FIG. 15 shows a cross-sectional view with respect to the line XV-XV' of FIG. 14.
Figure 16:
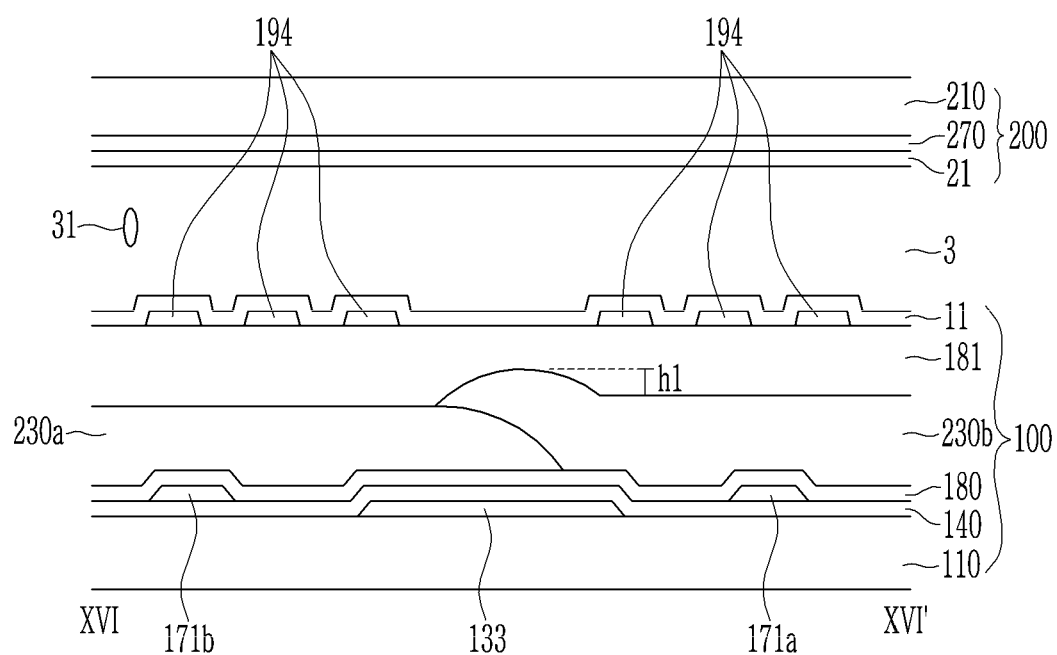
FIG. 16 shows a cross-sectional view with respect to the line XVI-XVI' of FIG. 14.
Figure 17:
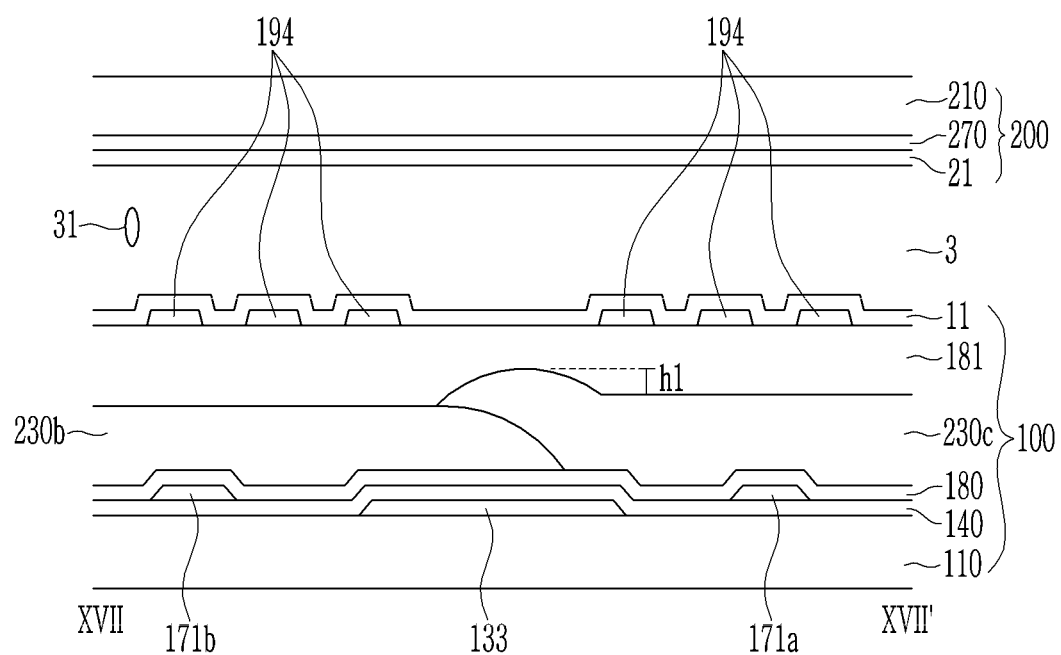
FIG. 17 shows a cross-sectional view with respect to the line XVII-XVII' of FIG. 14.

FIG. 14 shows a plan layout view of three pixels (PXa, PXb, and PXc) of a display device according to an exemplary embodiment. FIG. 15 shows a cross-sectional view with respect to the line XV-XV' of FIG. 14. FIG. 16 shows a cross-sectional view with respect to the line XVI-XVI' of FIG. 14, and FIG. 17 shows a cross-sectional view with respect to the line XVII-XVII' of FIG. 14.

Referring to FIG. 14, the display device includes a first pixel (PXa), a second pixel (PXb), and a third pixel (PXc) that are adjacent in the first direction (x). In this instance, the first pixel (PXa) may include a first color filter 230a to express a first color, the second pixel (PXb) may include a second color filter 230b to express a second color, and the third pixel (PXc) may include a third color filter 230c to express a third color. The first color, the second color, and the third color may be red, green, and blue, respectively. In another way, the first color, the second color, and the third color may be magenta, cyan, and yellow, respectively.

The display device according to an exemplary embodiment includes a lower panel 100 and an upper panel 200 facing each other, and a liquid crystal layer 3 provided between the display panels 100 and 200.

A display area (DA) of the lower panel 100 will now be described. The lower panel 100 includes a plurality of signal lines 121, 131, and 171, and a transistor Q.

The lower panel 100 includes a first substrate 110 made of transparent glass or plastic, and gate conductive layers 121 and 131 provided on the first substrate 110. The gate conductive layers 121 and 131 include a gate line 121 extending in the first direction (x), and a storage electrode line 131 extending substantially parallel to the gate line 121.

The gate line 121 transmits a gate signal (Gn) and includes a first gate electrode 124. One gate line 121 may include a pair of line portions 125 and 126. The one pair of line portions 125 and 126 may extend in the first direction (x) in parallel to each other. A gate electrode 124 is provided between the one pair of line portions 125 and 126, and the gate electrode 124 is connected to the one pair of line portions 125 and 126. Therefore, the pair of line portions 125 and 126 are electrically connected to each other by the gate electrode 124, and they may transmit the same gate signals. An opening 25 is provided between two gate electrodes 124 neighboring in the first direction (x) in the gate line 121. The pair of line portions 125 and 126 of the gate line 121 may be provided in parallel to each other, and may face each other with openings 25 therebetween in the region where no gate electrodes 124 are provided.

The storage electrode line 131 is separated from the gate line 121 and the gate electrode 124 in a plan view. The storage electrode line 131 may transmit a predetermined constant voltage. The storage electrode line 131 may include a main line 132 substantially extending in the first direction (x), an extension 133 connected to the main line 132 and substantially extending in the second direction (y), and an expansion 134 that is an expanded portion of the main line 132.

A gate insulating layer 140 is provided on the gate conductive layer. The gate insulating layer 140 may include an inorganic insulating material such as a silicon oxide ($SiO_x$) or a silicon nitride ($SiN_x$).

A semiconductor layer including semiconductors 154 and 156 is provided on the gate insulating layer 140. The semiconductor layer may include an amorphous, polysilicon, or oxide semiconductor material. The semiconductor 154 overlaps the gate electrode 124 in a plan view.

An ohmic contact 164 may be provided on the semiconductor 154. When the semiconductor layer includes silicon, the ohmic contact 164 may include n+ hydrogenated amorphous silicon to which an n-type impurity such as phosphorus (P) is doped with high concentration, or a silicide. The ohmic contact 164 may be omitted.

A data conductive layer including a data line 171, a source electrode 173, and a drain electrode 175 is provided on the ohmic contact 164 and the gate insulating layer 140.

The data line 171 generally extends in the second direction (y), and it may cross the gate line 121. The data line 171 includes a first data line 171a and a second data line 171b overlapping one pixel PX.

A source electrode 173 may be connected to the data lines 171a and 171b. The source electrode 173 may extend toward the gate electrode 124 from the data lines 171a and 171b and may be bent in a U shape. The drain electrode 175 may include a portion that faces the source electrode 173 in the region overlapping the gate electrode 124, and an expansion 176. The expansion 176 may be provided over the gate line 121 and the gate electrode 124 in a plan view. The region provided between the drain electrode 175 and the source electrode 173 facing each other may mostly overlap the semiconductor 154.

The expansion 176 may overlap the expansion 134 of the storage electrode line 131 in a plan view. The expansion 176 may overlap the expansion 134 of the storage electrode line 131 with the gate insulating layer 140 therebetween to form a storage capacitor Cst. The storage capacitor Cst may function to maintain the voltage at the drain electrode 175 and the pixel electrode 191 connected to the same when the data voltage is not applied to the data lines 171a and 171b.

The gate electrode 124, the source electrode 173, and the drain electrode 175 configure a transistor Q that is a switching element together with the semiconductor 154. A channel of the transistor Q is formed on the semiconductor 154 provided between the source electrode 173 and the drain electrode 175. One pixel PX may be electrically connected to one of the first data line 171*a* and the second data line 171*b* by the transistor Q, but as shown in FIG. 14, the case in which the pixel PX is connected to the first data line 171*a* will now be described.

The openings 25 of the gate line 121 overlap the data lines 171*a* and 171*b* in a plan view to thus reduce a signal delay caused by coupling between the gate line 121 and the data lines 171*a* and 171*b*. The semiconductor 156 may be provided between a portion where the gate line 121, the gate electrode 124, or the storage electrode line 131 crosses the data lines 171*a* and 171*b* to prevent an electrical short circuit between the gate conductive layer and the data conductive layer.

The ohmic contact 164 is provided between the semiconductor 154 (e.g., is provided below the semiconductor 154) and the data conductive layer (e.g., is provided above the data conductive layer), and it may reduce contact resistance therebetween. The semiconductor 154 may have a portion that is not covered by the data conductive layer in addition to between the source electrode 173 and the drain electrode 175.

An inorganic insulating layer 180 is provided on the data conductive layer, and a color filter 230 is provided on the inorganic insulating layer 180. The color filter 230 includes a first color filter 230*a*, a second color filter 230*b*, and a third color filter 230*c* for displaying different colors.

The first color filter 230*a*, the second color filter 230*b*, and the third color filter 230*c* may be arranged along the first direction (x). In other words, the first pixel PX1 may include a first color filter 230*a*, and the second pixel PX2 may include a second color filter 230*b*, and the third pixel PX3 may include a third color filter 230*c*. The first color filter 230*a*, the second color filter 230*b*, and the third color filter 230*c* overlap each other among the pixels PX1, PX2, and PX3 that are adjacent in the first direction (x). For example, the first color filter 230*a* overlaps the second color filter 230*b* in the region in which the first pixel PX1 is adjacent to the second pixel PX2, and the second color filter 230*b* overlaps the third color filter 230*c* in the region in which the second pixel PX2 is adjacent to the third pixel PX3. In the region where the color filters overlap each other, one color filter is provided to be above another color filter, and steps of the region where the color filters do not overlap each other and the region where the color filters overlap each other are formed. Hereinafter, the step of the region where the color filters 230 overlap each other will be referred to as a horn-shaped step.

Referring to FIG. 1-FIG. 4, the first color filter 230*a*, the second color filter 230*b*, and the third color filter 230*c* may be formed by performing a division and exposure process by use of a first mask 1001, a second mask 1002, and a third mask 1003.

A height h1 of the horn-shaped step may have different values depending on arranging degrees of the first color filter 230*a*, the second color filter 230*b*, and the third color filter 230*c*. Therefore, when a predetermined level of overlay distortion is generated at respective shot regions at the time of division and exposure, the heights h1 of the horn-shaped steps in the respective regions may become different. The height h1 of the horn-shaped step may influence the arrangement of liquid crystal molecules 31 provided in the region that is adjacent to the horn-shaped step, and may influence reflection of external light and a refractive index of light. Therefore, when the height h1 of the horn-shaped step becomes different in the respective shot regions, differences of luminance may be generated in the respective shot regions. When the luminance differences are large in the respective shot regions, their border lines are visible to the user, which is referred to as a stitch defect. The stitch defect may be clearly seen when the first color filter 230*a*, the second color filter 230*b*, and the third color filter 230*c* are exposed and the borders of the shot regions of the respective color filters match each other.

However, regarding the display device according to an exemplary embodiment, in the stage for exposing the first color filter 230*a*, the second color filter 230*b*, and the third color filter 230*c*, the first border line STL1 when the first color filter 230*a* is exposed, the second border line STL2 when the second color filter 230*b* is exposed, and the third border line STL3 when the third color filter 230*c* is exposed do not overlap each other, so it is difficult for the border line of the shot region to be visible to the user, and the stitch defect may be reduced or prevented.

A passivation layer 181 is provided on the color filter 230. The passivation layer 181 may include an organic material and may flatten an upper portion of the color filter 230.

A pixel electrode 191 is provided on the passivation layer 181. The pixel electrode 191 includes a cross-shaped stem including a horizontal stem 193 and a vertical stem 192, a plurality of branches 194 extending to the outside from the cross-shaped stem, and an expansion 197 connected to the expansion 176 of the drain electrode 175. The color filter 230 and the passivation layer 181 include an opening 185 for exposing the expansion 176 of the drain electrode 175. The expansion 197 of the pixel electrode 191 is physically and electrically connected to the expansion 176 of the drain electrode 175 through the opening 185 of the color filter 230 and the passivation layer 181 to thus receive a data voltage.

A first alignment layer 11 is provided on the pixel electrode 191. The first alignment layer may be a vertical alignment layer.

The upper panel 200 includes a second substrate 210 facing the first substrate 110, a common electrode 270 provided below the second substrate 210, and a second alignment layer 21 provided below the common electrode 270. The second alignment layer 21 may be a vertical alignment layer.

The liquid crystal layer 3 has negative dielectric anisotropy, and a long axis of the liquid crystal molecules 31 of the liquid crystal layer 3 may be aligned to be perpendicular to surfaces of the display panels 100 and 200 while there is no electric field. The pixel electrode 191 to which the data voltage is applied determines the direction of the liquid crystal molecules 31 of the liquid crystal layer 3 between the electrodes 191 and 270 by generating an electric field together with the common electrode 270 of the upper panel 200. Luminance of light passing through the liquid crystal layer 3 is adjusted according to the direction (e.g., a determined direction or alignment) of liquid crystal molecules.

Figure 18:
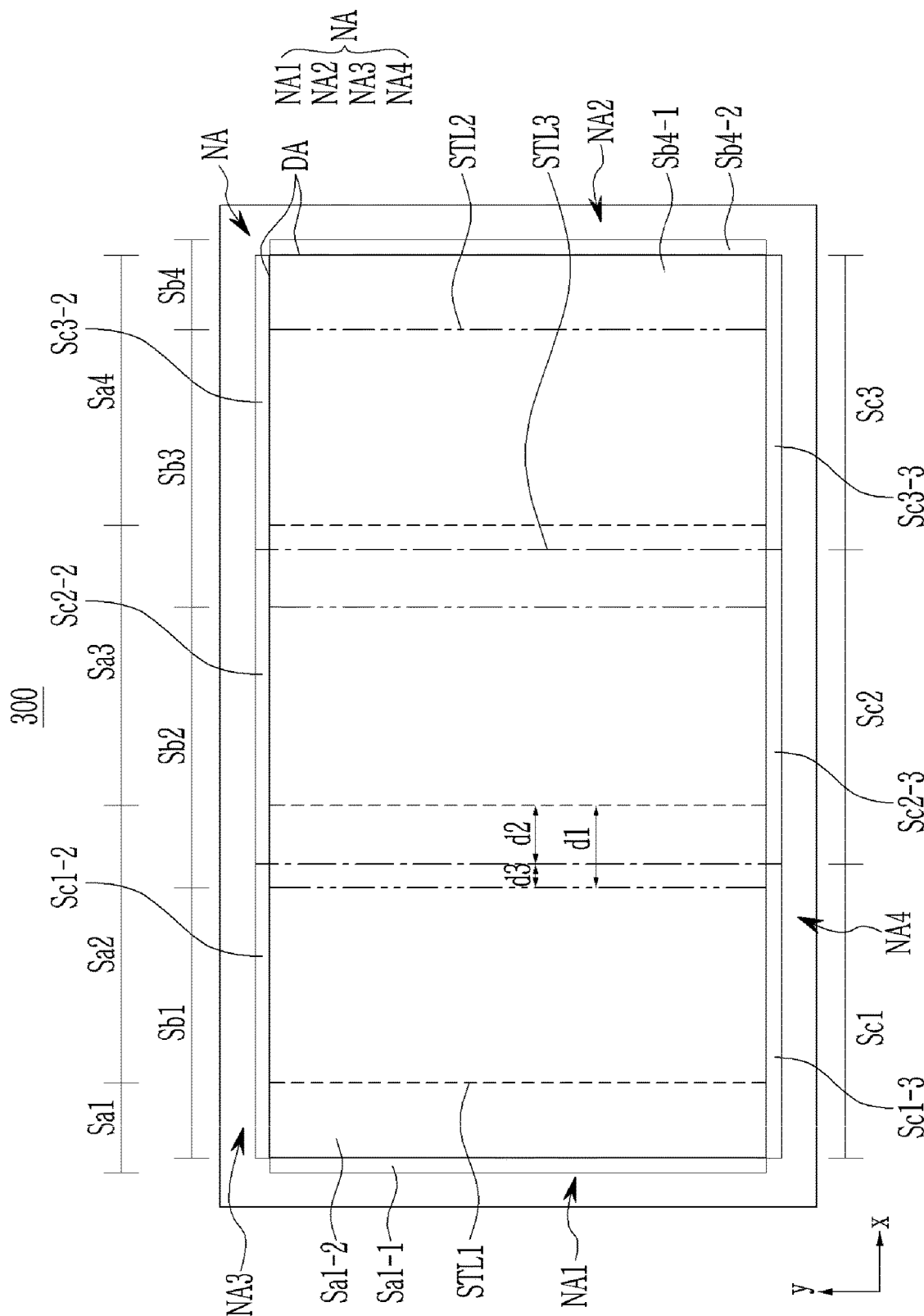
FIG. 18 shows a schematic diagram of a shot region of the display device according to an exemplary embodiment.

A display device according to an exemplary embodiment will now be described with reference to FIG. 18. FIG. 18 shows a schematic diagram of a shot region of a display device according to an exemplary embodiment. Except for the first shot region Sc1, the second shot region Sc2, and the third shot region Sc3 of the third color filter, the display device according to the present exemplary embodiment is similar to the display device of FIG. 5, so repeated descriptions may not be provided.

Referring to FIG. 18, the first shot region Sc1, the second shot region Sc2, and the third shot region Sc3 of the third color filter are provided in the non-display area (NA). The first shot region Sc1, the second shot region Sc2, and the third shot region Sc3 of the third color filter include third non-display shot regions (Sc1-2, Sc2-2, and Sc3-2) provided in the third non-display area NA3, and fourth non-display shot regions (Sc1-3, Sc2-3, and Sc3-3) provided in the fourth non-display area NA4. Therefore, a first color filter pattern may be provided in the first non-display area NA1, a second color filter pattern may be provided in the second non-display area NA2, and a third color filter pattern may be provided in the third non-display area NA3 and the fourth non-display area NA4.

In exemplary embodiments, the shot regions Sa1, Sa2, Sa3, and Sa4 of the first color filter or the shot regions Sb1, Sb2, Sb3, and Sb4 of the second color filter may be provided in the third non-display area NA3 and the fourth non-display area NA4. In this case, the first color filter pattern may be provided in the first non-display area NA1, the second color filter pattern may be provided in the second non-display area NA2, and the first color filter pattern or the second color filter pattern may be provided in the third non-display area NA3 and the fourth non-display area NA4.

Figure 19:
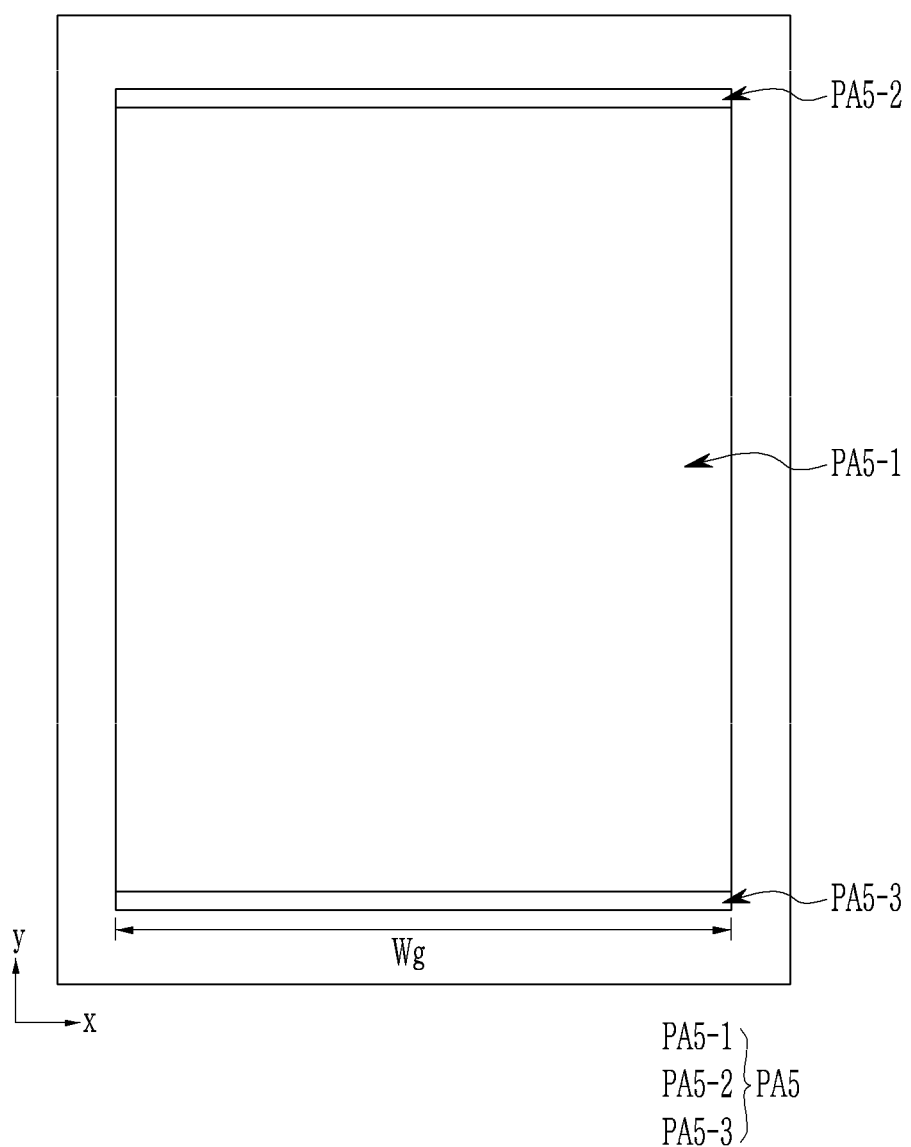
FIG. 19 shows a top plan view of a third mask according to an exemplary embodiment.

A mask according to an exemplary embodiment will now be described with reference to FIG. 19. FIG. 19 shows a top plan view of a third mask 3003.

The mask according to an exemplary embodiment includes a first mask for exposing the first color filter 230a, a second mask for exposing the second color filter 230b, and a third mask 3003 for exposing the third color filter 230c. The first mask and the second mask according to the present exemplary embodiment correspond to the first mask 2001 of FIG. 6 and the second mask 2002 of FIG. 7.

Referring to FIG. 19, the third mask 3003 includes a fifth pattern area PA5. The fifth pattern area PA5 includes a third non-display pattern area (PA5-2), a third display pattern area (PA5-1), and a fourth non-display pattern area (PA5-3).

The fifth pattern area PA5 of the third mask 3003 includes a pattern corresponding to the third color filter pattern of the first shot region Sc1, the second shot region Sc2, and the third shot region Sc3 of the third color filter in FIG. 18.

The third non-display pattern area (PA5-2) of the fifth pattern area PA5 includes a pattern corresponding to the third color filter pattern provided in the third non-display area NA3 of FIG. 18, and the fourth non-display pattern area (PA5-3) of the fifth pattern area PA5 includes a pattern corresponding to the third color filter pattern provided in the fourth non-display area NA4 of FIG. 18.

Figure 20:
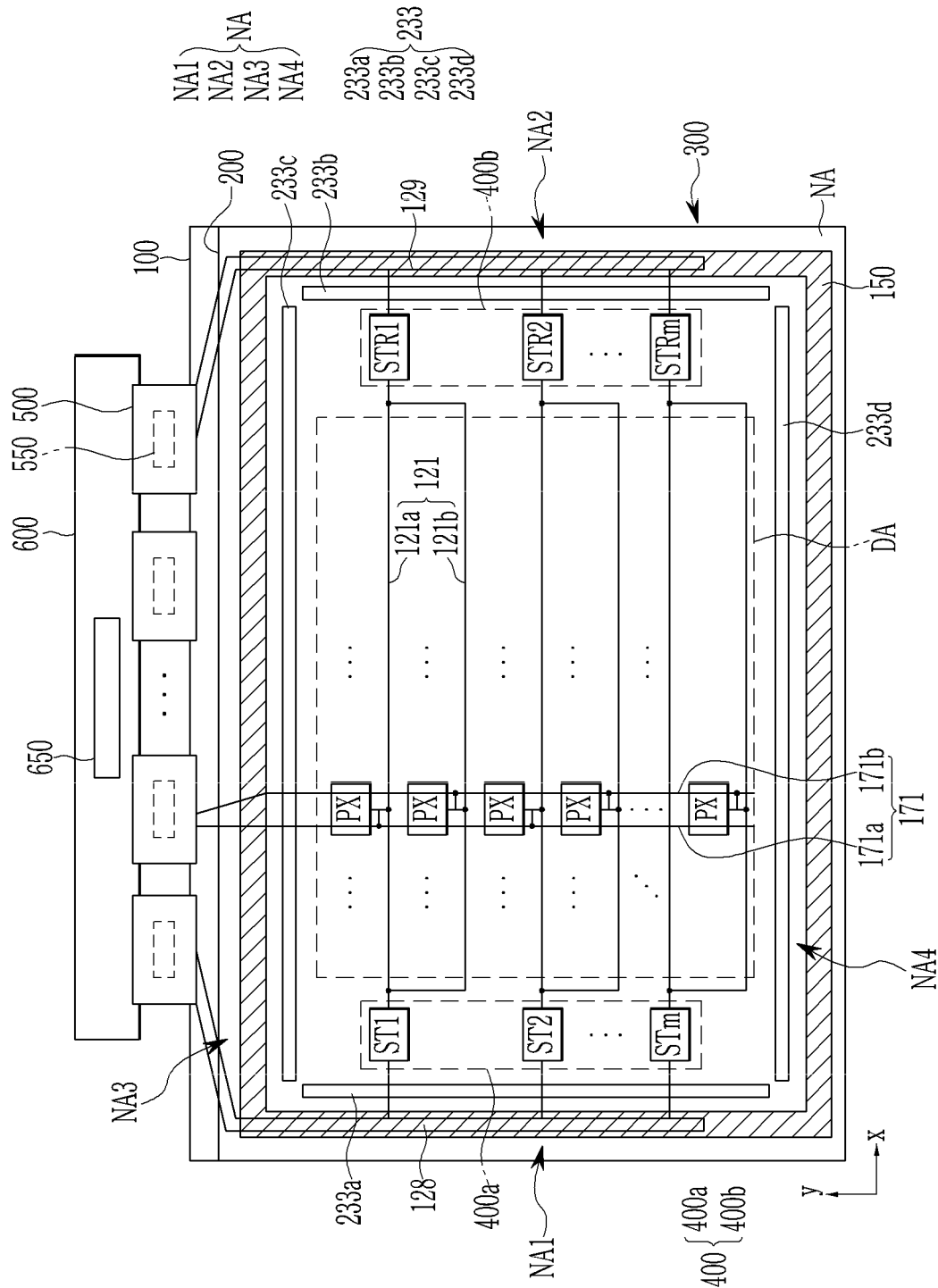
FIG. 20 shows a top plan view of a display device according to an exemplary embodiment.

A display device according to an exemplary embodiment will now be described with reference to FIG. 20. FIG. 20 shows a top plan view of a display device according to an exemplary embodiment. FIG. 20 corresponds to the display device of FIG. 9 except that it includes a third color filter dam 233c and a fourth color filter dam 233d.

Referring to FIG. 20, the third color filter dam 233c is provided in the third non-display area NA3, and the fourth color filter dam 233d is provided in the fourth non-display area NA4. The third color filter dam 233c and the fourth color filter dam 233d extend in the first direction (x) between the sealant 150 and the display area (DA).

The third color filter dam 233c and the fourth color filter dam 233d include the same material as one material of the first color filter, the second color filter, and the third color filter of the display area (DA). The third color filter dam 233c and the fourth color filter dam 233d may include the same material. The third color filter dam 233c and the fourth color filter dam 233d may include a color filter material that is different from the first color filter dam 233a and the second color filter dam 233b. For example, the first color filter dam 233a may include a first color filter, the second color filter dam 233b may include a second color filter, and the third color filter dam 233c may include a third color filter.

In this embodiment, the third color filter dam 233c may correspond to a third color filter pattern provided in the third non-display shot regions (Sc1-2, Sc2-2, Sc3-2) of FIG. 18, and the fourth color filter dam 233d may correspond to a third color filter pattern provided in the fourth non-display shot regions (Sc1-3, Sc2-3, Sc3-3) of FIG. 18.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:
1. A display device comprising:
a first substrate comprising a display area and a non-display area comprising a first non-display area and a second non-display area at respective sides of the display area with respect to a first direction;
a color filter in the display area and comprising a first color filter, a second color filter, and a third color filter;
a color filter dam in the non-display area;
a data conductive layer on the first substrate; and
an inorganic insulating layer on the data conductive layer, wherein the color filter dam comprises a first color filter dam in the first non-display area and a second color filter dam in the second non-display area,
the first color filter dam comprises a same material as the first color filter, and
the second color filter dam comprises a same material as the second color filter, and
wherein the display area is disposed between the first non-display area and the second non-display area with respect to the first direction, and
a color of the first color filter dam and a color of the second color filter dam are different, and
wherein the color filter dam is on the inorganic insulating layer and overlaps the data conductive layer.
2. The display device of claim 1, further comprising:
a sealant in the non-display area and around at least a part of the non-display area and the display area.
3. The display device of claim 2, wherein
the first color filter dam is between a portion of the sealant that is in the first non-display area, and the display area, and
the second color filter dam is between a portion of the sealant that is in the second non-display area, and the display area.
4. The display device of claim 3, further comprising:
a gate conductive layer on the first substrate; and
a gate insulating layer on the gate conductive layer,
wherein the color filter dam is on the gate insulating layer and overlaps the gate conductive layer.
5. The display device of claim 3, further comprising:
a gate driver in the non-display area,
wherein the gate driver comprises a transistor, and
the color filter dam overlaps the transistor.
6. The display device of claim 3, further comprising:
a support pattern in the non-display area; and
a spacer overlapping the support pattern.

7. The display device of claim 6, wherein
the support pattern includes a first support pattern in the first non-display area and a second support pattern in the second non-display area,
the first support pattern comprises a same material as the first color filter dam, and
the second support pattern comprises a same material as the second color filter dam.

8. The display device of claim 3, wherein
the non-display area further comprises a third non-display area and a fourth non-display area with the display area therebetween with respect to a second direction crossing the first direction,
the color filter dam further comprises a third color filter dam in the third non-display area and a fourth color filter dam in the fourth non-display area, and
the third color filter dam and the fourth color filter dam each comprise a same material as one of the first color filter, the second color filter, and the third color filter.

9. The display device of claim 8, wherein
the third color filter dam and the fourth color filter dam comprise a same material as the third color filter.

10. A photomask for a color filter, the photomask comprising:
a first mask for a first color filter comprising a first pattern area and a second pattern area;
a second mask for a second color filter comprising a third pattern area and a fourth pattern area; and
a third mask for a third color filter comprising a fifth pattern area,
wherein the first pattern area comprises a first display pattern area,
the fourth pattern area comprises a second display pattern area,
the first display pattern area and the second pattern area comprise a pattern of the first color filter of a display area of a display device, the first display pattern area corresponding to a first shot region of the first color filter, and the second pattern area corresponding to second, third, and fourth shot regions of the first color filter,
the third pattern area and the second display pattern area comprise a pattern of the second color filter of the display area, the third pattern area corresponding to first, second, and third shot regions of the second color filter, and the second display pattern area corresponding to a fourth shot region of the second color filter,
the fifth pattern area comprises a pattern of the third color filter of the display area and corresponds to first, second, and third shot regions of the third color filter, and
a width of the first display pattern area, a width of the third pattern area, and a width of the fifth pattern area are different from each other.

11. The photomask of claim 10, wherein
a summation of the width of the first display pattern area and a width of the second pattern area is different from the width of the third pattern area and the width of the fifth pattern area.

12. The photomask of claim 11, wherein
a width of the second display pattern area, the width of the second pattern area, and the width of the fifth pattern area are different from each other.

13. The photomask of claim 12, wherein
a summation of the width of the second display pattern area and the width of the third pattern area is different from the width of the second pattern area and the width of the fifth pattern area.

14. The photomask of claim 13, wherein
the first pattern area further comprises a first non-display pattern area including a pattern of the first color filter of a non-display area of the display device.

15. The photomask of claim 14, wherein
the fourth pattern area further comprises a second non-display pattern area including a pattern of the second color filter of the non-display area.

16. The photomask of claim 15, wherein
the fifth pattern area comprises a third non-display pattern area on a first side.

17. The photomask of claim 16, wherein
the fifth pattern area comprises a fourth non-display pattern area on a second side.

18. A method for manufacturing a display device, the method comprising:
exposing an initial shot region of a first color filter with a first pattern area of a first mask;
dividing a display area of the display device for displaying an image into a plurality of shot regions and exposing the first color filter with a second pattern area of the first mask;
dividing the display area into a plurality of shot regions and exposing a second color filter with a third pattern area of a second mask;
exposing a final shot region of the second color filter with a fourth pattern area of the second mask; and
dividing the display area into a plurality of shot regions and exposing a third color filter with a fifth pattern area of a third mask,
wherein the first pattern area corresponds to the initial shot region of the first color filter, the second pattern area corresponds to second, third, and fourth shot regions of the first color filter, the third pattern area corresponds to first, second, and third shot regions of the second color filter, the fourth pattern area corresponds to the final shot region of the second color filter, and the fifth pattern area corresponds to first, second, and third shot regions of the third color filter,
wherein a width of the first pattern area, a width of the third pattern area, and a width of the fifth pattern area are different from each other,
wherein a first border line between the shot regions of the first color filter, a second border line between the shot regions of the second color filter, and a third border line between the shot regions of the third color filter do not overlap each other.

19. The method of claim 18, wherein
the exposing of the initial shot region of the first color filter with the first pattern area of the first mask is performed by exposing a first display shot region and a first non-display shot region of the initial shot region of the first color filter,
the exposing of the final shot region of the second color filter with the fourth pattern area of the second mask is performed by exposing a second display shot region and a second non-display shot region of the final shot region of the second color filter,
the first display shot region and the second display shot region are in the display area, and the first non-display shot region and the second non-display shot region are in a non-display area of the display device.

\* \* \* \* \*